(12) United States Patent
Lin et al.

(10) Patent No.: US 12,507,600 B2
(45) Date of Patent: Dec. 23, 2025

(54) PHASE CHANGE MEMORY DEVICE WHEREIN FIRST AND SECOND ELECTRODES PENETRATE THROUGH DIELECTRIC AND PHASE CHANGE LAYERS

(71) Applicant: Taiwan Semiconductor Manufacturing Company, Ltd., Hsinchu (TW)

(72) Inventors: Yu-Chao Lin, Hsinchu (TW); Jung-Piao Chiu, Kaohsiung (TW); Shao-Ming Yu, Hsinchu County (TW); Yuan-Tien Tu, Chiayi County (TW); Tung-Ying Lee, Hsinchu (TW)

(73) Assignee: Taiwan Semicondcutor Manufacturing Company, Ltd., Hsinchu (TW)

( * ) Notice: Subject to any disclaimer, the term of this patent is extended or adjusted under 35 U.S.C. 154(b) by 663 days.

(21) Appl. No.: 17/873,166

(22) Filed: Jul. 26, 2022

(65) Prior Publication Data
US 2024/0040938 A1  Feb. 1, 2024

(51) Int. Cl.
*H10N 70/20* (2023.01)
*H10B 63/00* (2023.01)
*H10N 70/00* (2023.01)

(52) U.S. Cl.
CPC ........... *H10N 70/231* (2023.02); *H10B 63/80* (2023.02); *H10N 70/063* (2023.02); *H10N 70/826* (2023.02); *H10N 70/841* (2023.02)

(58) Field of Classification Search
CPC ..... H10N 70/231; H10N 70/823; H10B 63/10
See application file for complete search history.

(56) References Cited

U.S. PATENT DOCUMENTS

| | | | |
|---|---|---|---|
| 2008/0217600 A1* | 9/2008 | Gidon | G11C 13/0004 438/54 |
| 2015/0263070 A1* | 9/2015 | Lee | H10N 70/20 257/421 |
| 2021/0320250 A1* | 10/2021 | Heiss | H10N 70/823 |
| 2022/0180926 A1* | 6/2022 | Villa | H10N 70/882 |

* cited by examiner

*Primary Examiner* — Davienne N Monbleau
*Assistant Examiner* — Dmitri Mihaliov
(74) *Attorney, Agent, or Firm* — JCIPRNET

(57) ABSTRACT

A memory device includes a substrate, a first signal line, a first dielectric layer, a phase change layer, a second dielectric layer, a first electrode, a second electrode and a second signal line. The first signal line is disposed over the substrate. The first dielectric layer is disposed over the first signal line. The phase change layer is disposed over the first dielectric layer. The second dielectric layer is disposed over the phase change layer. The first electrode and the second electrode are penetrating through the first dielectric layer, the phase change layer and the second dielectric layer, wherein the phase change layer is located between the first electrode and the second electrode. The second signal line is disposed over the second dielectric layer, wherein the first signal line is electrically connected with the first electrode, and the second signal line is electrically connected with the second electrode.

20 Claims, 19 Drawing Sheets

PHASE CHANGE MEMORY DEVICE WHEREIN FIRST AND SECOND ELECTRODES PENETRATE THROUGH DIELECTRIC AND PHASE CHANGE LAYERS

BACKGROUND

Phase change memory (PCM) is a type of non-volatile memory in which the state of a function area in the phase change material is switched between crystalline and amorphous, e.g., by a current flow that generates heat. The state of the function area is then used to represent the stored data. Generally speaking, in the PCM, after the current passes through the bottom electrode, the bottom electrode generates thermal energy, and the thermal energy causes the PCM to switch between the crystalline state and the amorphous state. For example, after a heat excitation if the function area is in the crystalline state, the stored data is a low logic level. But if the function area is in the amorphous state, the stored data is a high logic level. Phase change memory is also known as phase random access memory (PRAM), phase change random access memory (PCRAM), ovonic unified memory, chalcogenide random access memory (or C-RAM), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 8A schematically illustrates top views of the fabrication method of the memory device in FIG. 1.

FIGS. 2B to 8B schematically illustrates cross-sectional views of the fabrication method of the memory device in FIG. 1.

FIGS. 12A to 17A schematically illustrates top views of the fabrication method of the memory device in FIG. 11.

FIGS. 12B to 17B schematically illustrates cross-sectional views of the fabrication method of the memory device in FIG. 11.

DETAILED DESCRIPTION

Figure 1:
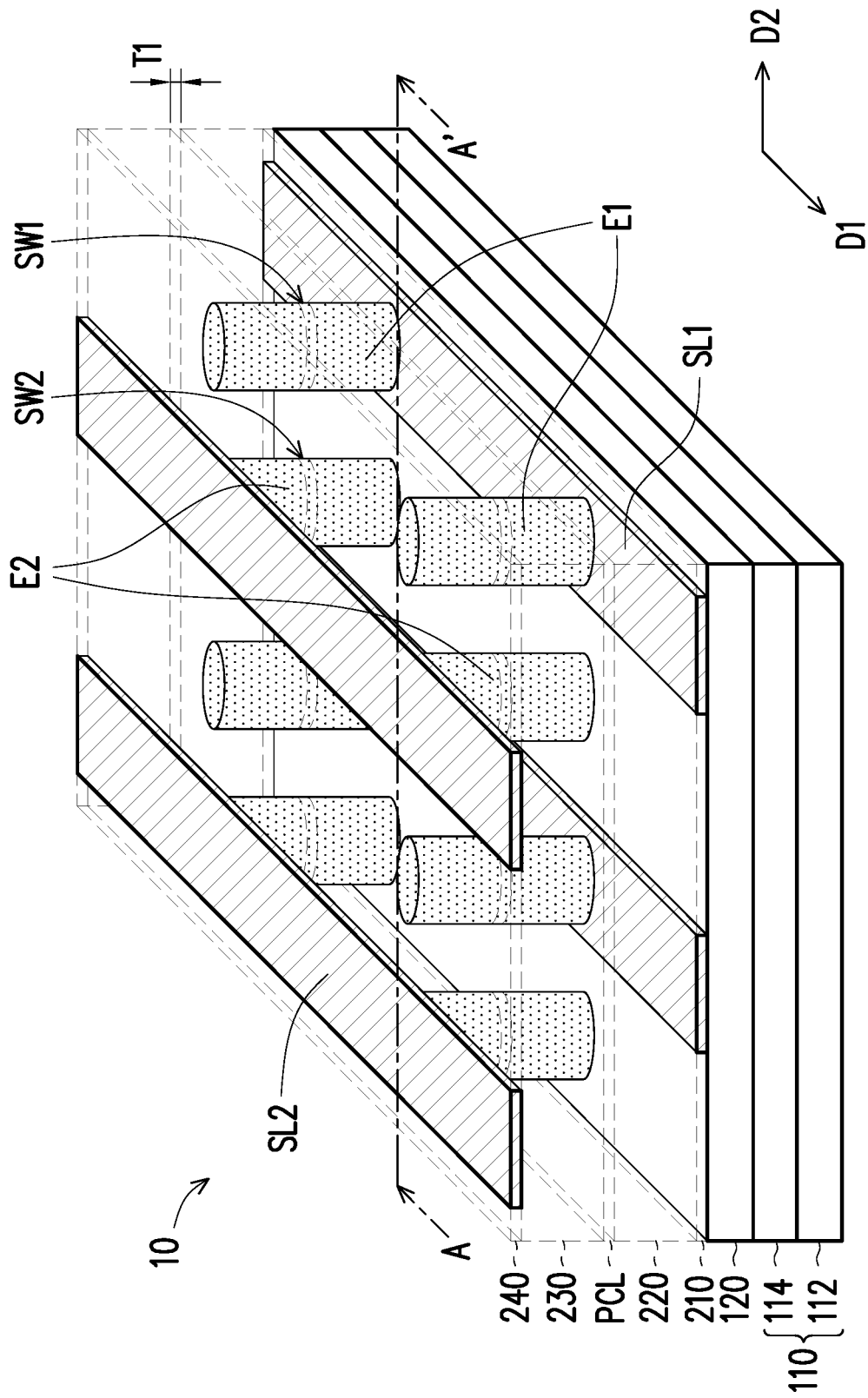
FIG. 1 is a perspective view of a memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

This disclosure relates to a fabrication method of a memory device including a phase change layer disposed between sidewalls of electrodes. The contact area between the phase change layer and the electrodes can be controlled by adjusting the thickness of the phase change layer, therefore, the contact area between the phase change layer and the electrodes can be reduced easily.

FIG. 1 is a perspective view of a memory device 10 in accordance with various embodiments of the present disclosure. Referring to FIG. 1, the memory device 10 includes a substrate 110, one or more inter-metal dielectric (IMD) layer 120, a first insulation layer 210, first signal lines SL, a first dielectric layer 220, a phase change layer PCL, a second dielectric layer 230, first electrodes E1, second electrodes E2, a second insulation layer 240 and second signal lines SL2.

In FIG. 1, one first electrode E1, one second electrode E2, and a portion of the phase change layer PCL between the one first electrode E1 and the one second electrode E2 form a memory cell. In FIG. 1, the memory device 10 includes fourth memory cells, but the disclosure is not limited thereto. The number of the memory cells can be adjusted according to the actual needs.

In FIG. 1, the memory cells are formed over the substrate 110. In some embodiments, the substrate 110 is a wafer including a semiconductor layer 112 and a circuit layer 114 formed over the semiconductor layer 112. The memory cells may be formed above a logic region or a memory region of the wafer. Furthermore, one or more inter-metal dielectric (IMD) layer 120 may be disposed between the substrate 110 and the memory cells. The IMD 120 may be an interconnection between the circuit 114 and the memory cells. In some embodiments, the IMD layer 120 may be silicon oxide, low-k silicon oxide such as a porous silicon oxide layer, other suitable interlayer dielectric (ILD) material, other suitable inter-metal dielectric material, combinations thereof, or the like. In some embodiments, the IMD layer 120 is a low-k dielectric layer made from extra low-k materials, extreme low-k materials, combinations thereof, or the like. In some embodiments, the dielectric material in the IMD layer 120 may have a dielectric constant lower than 2.4. The IMD layer 120 also includes conductive elements for interconnecting the memory cells and the circuit 114.

The first signal lines SL1 and the first insulation layer 210 are disposed over the substrate 110. The first signal lines SL1 and the first insulation layer 210 are located on the IMD layer 120. The first signal lines SL1 are embedded in the first insulation 210 and extending along a first direction D1. In some embodiments, the first signal lines SL1 may include, for example, AlCu, Cu, Ru or other suitable materials. In some embodiments, the first insulation layer 210 may include, for example, silicon oxide, low-k silicon oxide such as a porous silicon oxide layer, other suitable dielectric material, combinations thereof, or the like.

The first dielectric layer 220 is disposed over the first signal lines SL1 and the first insulation layer 210. The first signal lines SL1 and the first insulation layer 210 are disposed between the first dielectric layer 220 and the substrate 110. The phase change layer PCL is disposed over the first dielectric layer 220. The second dielectric layer 230 is disposed over the phase change layer PCL. The phase change layer PCL is located between the first dielectric layer 220 and the second dielectric layer 230. In some embodiments, the first dielectric layer 220 and the second dielectric layer 230 may include, for example, silicon oxide, low-k silicon oxide such as a porous silicon oxide layer, other suitable dielectric material, combinations thereof, or the like. In some embodiments, the phase change layer PCL may include, for example, a chalcogenide alloy such as GeSbTe (PCL). Alternatively, the phase change layer PCL may include Si—Sb—Te alloys, Ga—Sb—Te alloys, As—Sb Te alloys, Ag—In—Sb—Te alloys, Ge—In—Sb—Te alloys, Ge—Sb alloys, Sb—Te alloys, Si—Sb alloys, or combinations thereof. The phase change layer PCL has a crystalline state with a low resistivity and an amorphous state with a high resistivity.

The first electrodes E1 and the second electrodes E2 are located in the first dielectric layer 220, the phase change layer PCL and the second dielectric layer 230. The first electrodes E1 and the second electrodes E2 are penetrating through the first dielectric layer 220, the phase change layer PCL and the second dielectric layer 230. The first electrodes E1 and the second electrode E2 are surrounded by the first dielectric layer 220, the phase change layer PCL and the second dielectric layer 230. The first dielectric layer 220, the phase change layer PCL and the second dielectric layer 230 are located between sidewalls SW1 of first electrodes E1 and sidewalls SW2 of the second electrodes E2. In some embodiments, both of the first dielectric layer 220, the phase change layer PCL and the second dielectric layer 230 are in contact with the sidewalls SW1 of the first electrodes E1 and the sidewalls SW2 of the second electrodes E2. The first electrodes E1 and the second electrodes E2 are alternately arranged along a second direction D2 not parallel to the first direction D1. In some embodiments, the second direction D2 is perpendicular to the first direction D1.

The first signal lines SL1 are electrically connected with the first electrodes E1. For example, bottom surfaces of the first electrodes E1 are in contact with the first signal lines SL1. The second electrodes E2 are separated from the first signal lines SL1. For example, bottom surfaces of the second electrodes E2 are in contact with the first insulation layer 210.

In some embodiments, the first electrodes E1 and the second electrode E2 can be made of Ti, TiN, or other suitable materials.

The second insulation layer 240 is disposed over the second dielectric layer 230 and the first electrodes E1. The second signal lines SL2 are embedded in the second insulation layer 240 and extending along the first direction D1. The first signal lines SL1 are parallel to the second signal lines SL2. In some embodiments, the second signal lines SL2 may include, for example, AlCu, Cu, Ru or other suitable materials. In some embodiments, the second insulation layer 240 may include, for example, silicon oxide, low-k silicon oxide such as a porous silicon oxide layer, other suitable dielectric material, combinations thereof, or the like.

The second signal lines SL2 are electrically connected with the second electrodes E2. For example, top surfaces of the second electrodes E2 are in contact with the second signal lines SL2. The first electrodes E1 are separated from the second signal lines SL2. For example, top surfaces of the first electrodes E1 are in contact with the second insulation layer 240.

In a PCM in which a phase change layer is located vertically between two electrodes, the contact area between the phase change layer and the electrodes may be reduced by reducing the top surface or the bottom surface of the electrodes. However, the top surface or the bottom surface of the electrodes are usually limited by the critical dimension (CD) of the lithography process. Therefore, compared with the PCM in which a phase change layer is located vertically between two electrodes, the memory device 10 of the present embodiment may have a smaller contact area between the phase change layer PCL and the electrodes. In FIG. 1, for example, the contact area between the first electrodes E1 and the phase change layer PCL and the contact area between the second electrodes E2 and the phase change layer PCL can be reduced by reducing the thickness T1 of the phase change layer PCL.

In this embodiment, after the current passes through the first electrodes E1, the first electrodes E1 generate thermal energy, and the thermal energy causes the phase change layer PCL to switch between the crystalline state and the amorphous state. Therefore, the phase change layer PCL located between the first electrodes E1 and the second electrodes E2 can be switched between the high resistance state (HRS) and the low resistance state (LRS). Since the memory device 10 have a smaller contact area between the phase change layer PCL and the electrodes, the memory device 10 has the advantages of low programming current (set current or reset current) and fast working time.

FIGS. 2A to 8A schematically illustrates top views of the fabrication method of the memory device in FIG. 1. FIGS. 2B to 8B schematically illustrates cross-sectional views of the fabrication method of the memory device in FIG. 1. Various operations of the fabrication method are discussed in association with cross-section diagrams FIGS. 2B to 8B, where illustrate cross-sectional views along the line A-A illustrated in FIG. 1. FIGS. 2A to 8A are in association with top views of structures in FIGS. 2B to 8B, respectively.

Figure 2A:
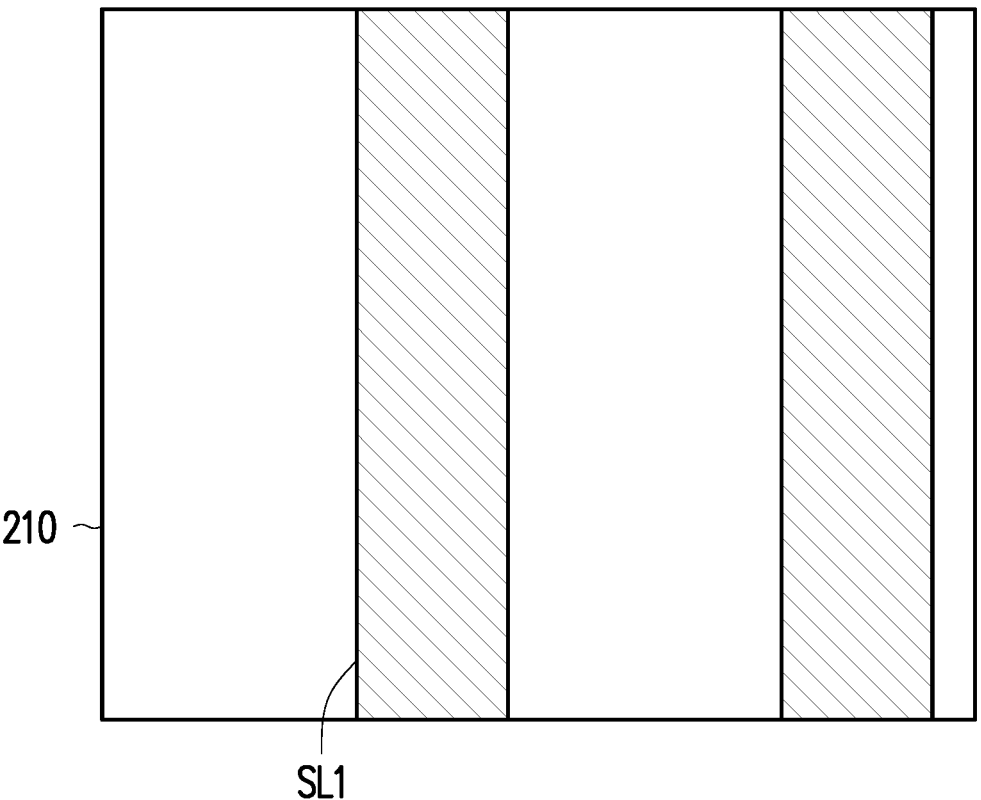
Figure 2B:
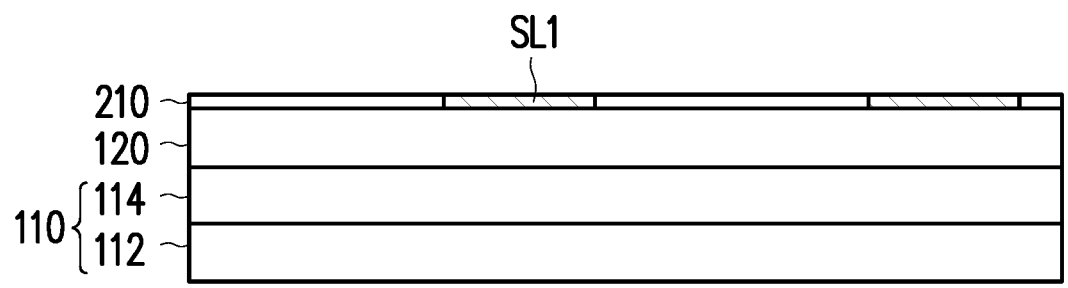

Referring to FIGS. 2A and 2B, a substrate 110 having a semiconductor layer 112 and a circuit 114 formed thereon is provided. The semiconductor layer 112 may be a silicon substrate. Alternatively, the semiconductor layer 112 may include another elementary semiconductor, such as germanium; a compound semiconductor including silicon carbide; an alloy semiconductor including silicon germanium; or combinations thereof. The semiconductor layer 112 may include doped regions, such as p-wells and n-wells. In some embodiments, the substrate 110 is a workpiece that includes the semiconductor layer 112 and various features formed in and over and attached to the semiconductor layer 112. In some embodiments, the substrate 110 further includes an insulator over the semiconductor layer 112. That is, the substrate 110 may include a semiconductor on insulator (SOI) substrate. In some embodiments, the circuit 114 includes transistors formed by transistor fabrication processes and may be a planar transistor, such as polysilicon gate transistors or high-k metal gate transistors, or a multi-gate transistor, such as fin field effect transistors. After the transistors are formed, one or more metal/dielectric layers of a multi-level interconnect (MLI) is formed over the transistors. According to some embodiments, plural metal/dielectric layers are formed over the transistors. In some embodiments, the circuit 114 may be a logic circuit or a memory circuit.

At least one IMD layer 120 is formed over the substrate 110, as shown in FIG. 2B. The IMD layer 120 may provide electrical interconnection between the memory cells and the circuit 114 as well as structural support for the various features of the memory device during many fabrication process operations, some of which will be discussed herein.

The first signal lines SL1 embedded in the first insulation layer 210 are formed above the substrate 110. In this embodiment, the first signal lines 310 and the first insulation layer 210 are formed on the IMD layer 120. In some embodiments, the first signal lines 310 may be formed by a damascene process. Specifically, a plurality of openings are formed in the first dielectric layer 210. Then, a filling material is formed in the openings of the first dielectric layer 210. The filling material is electrically connected to the IMD layer 120. Then, excessive portion of the filling material is removed by performing a CMP process to form the first signal lines SL1 embedded in the first dielectric layer 210.

Figure 3A:
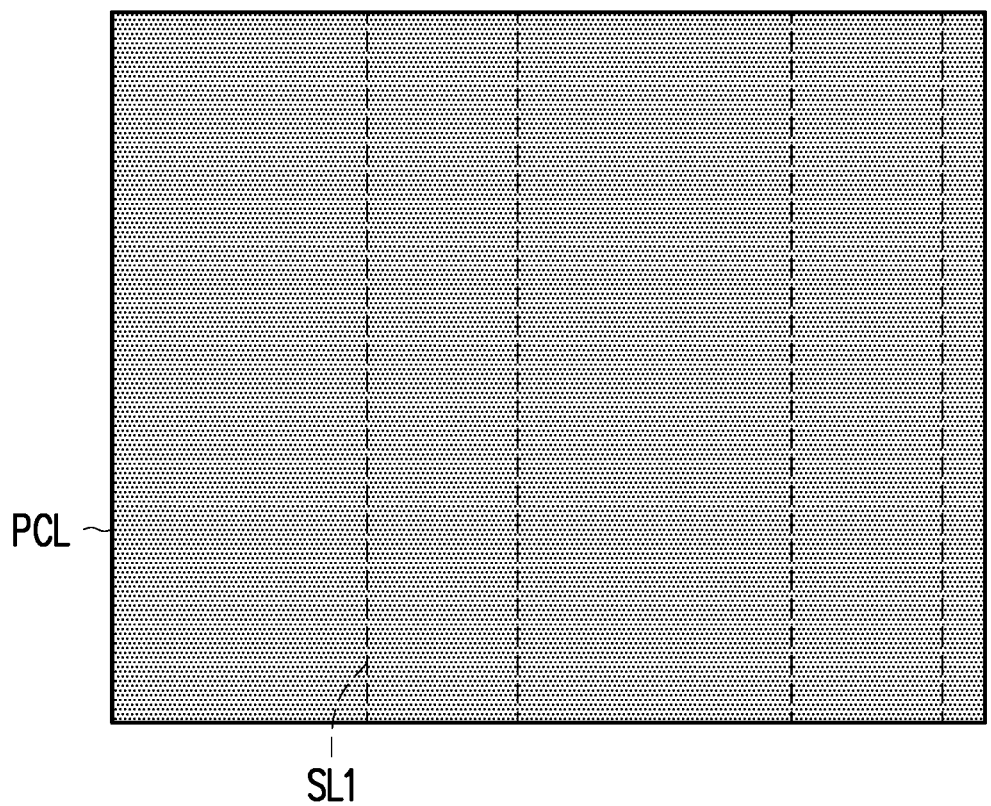
Figure 3B:
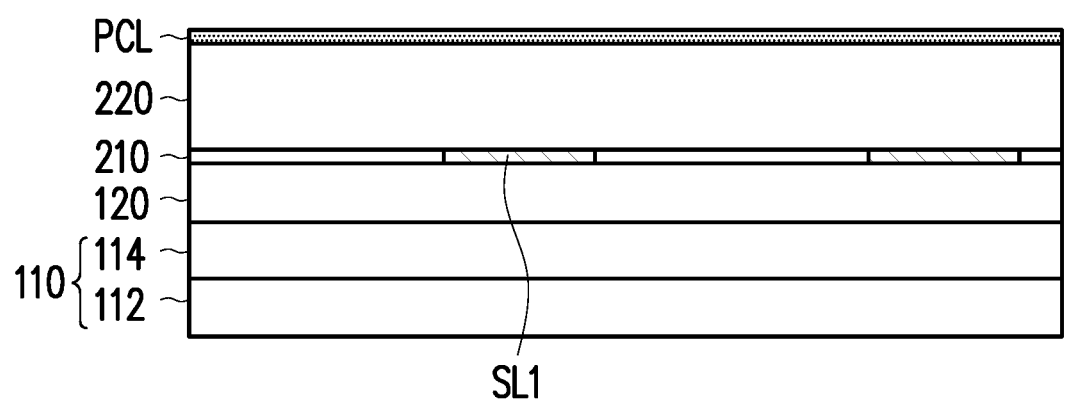

Referring to FIGS. 3A and 3B, a first dielectric layer 220 is formed over the first signal lines SL1 and the first insulation layer 210. In some embodiments, the first dielectric layer 220 may be deposited by physical vapor deposition (PVD), chemical vapor deposition (CVD), or other suitable process(es). A phase change layer PCL is formed over the first dielectric layer 220. In some embodiments, the phase change layer PCL is blanket on the first dielectric layer 220. In some embodiments, the phase change layer PCL may be deposited by PVD, CVD, atomic layer deposition (ALD) process, or other suitable process(es).

Figure 4A:
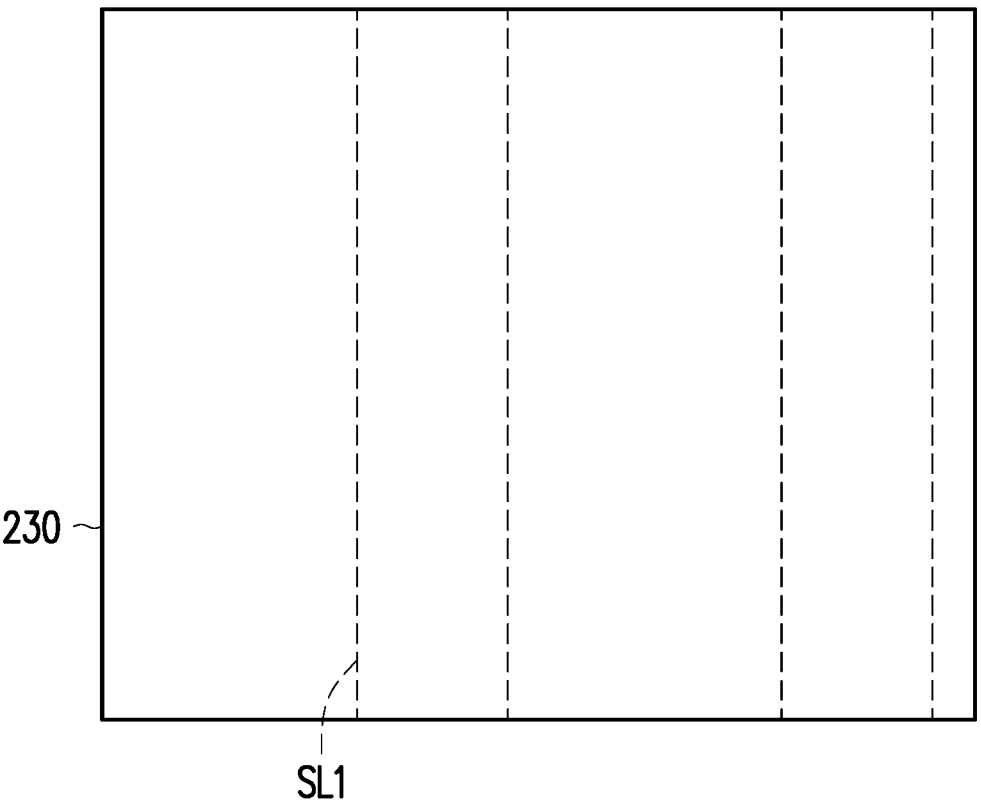
Figure 4B:
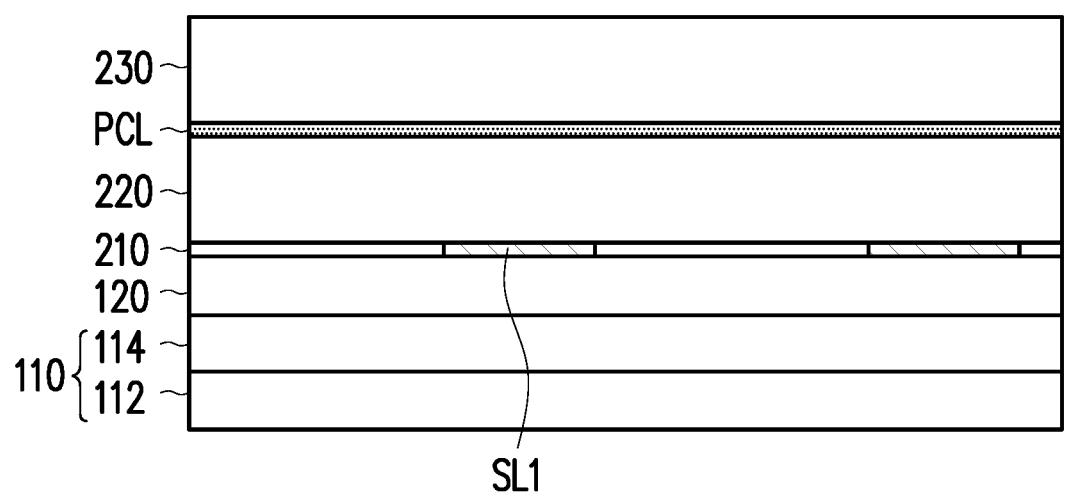

Referring to FIGS. 4A and 4B, a second dielectric layer 230 is formed over the phase change layer PCL. The second dielectric layer 230 may be deposited by PVD, CVD, or other suitable process(es).

Figure 5A:
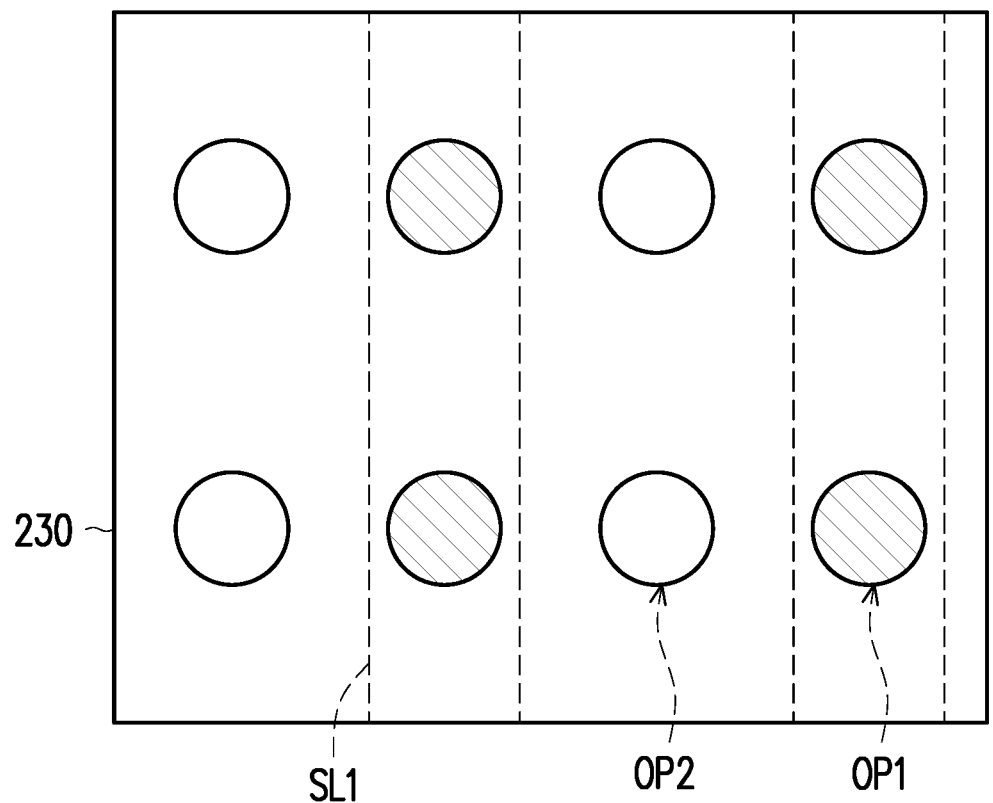
Figure 5B:
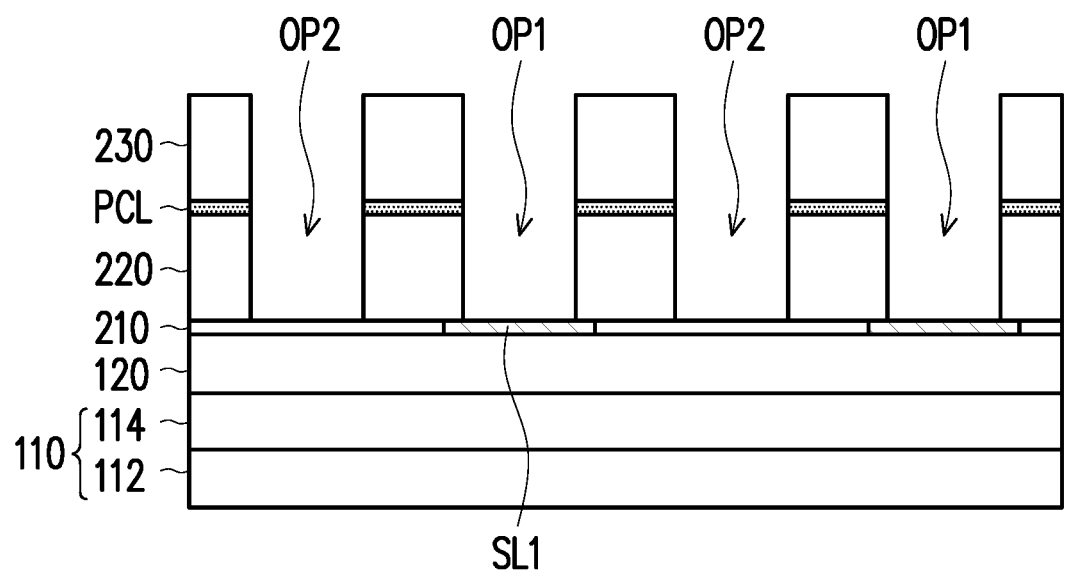

Referring to FIGS. 5A and 5B, first openings OP1 and second openings OP2 are formed in the first dielectric layer 220, the phase change layer PCL and the second dielectric layer 230. The first openings OP1 and the second openings OP2 are penetrating through the first dielectric layer 220, the phase change layer PCL and the second dielectric layer 230.

In some embodiments, the method of forming the first openings OP1 and second openings OP2 includes: forming a hard mask layer (not shown) on the second dielectric layer 230; forming a patterned photoresist layer (not shown) on the hard mask layer; using the patterned photoresist layer as a mask to pattern the hard mask layer; then, using the residual hard mask layer as a mask to pattern the first dielectric layer 220, the phase change layer PCL and the second dielectric layer 230. In some embodiments, the first openings OP1 and the second openings OP2 are formed in one or more etching process using the same mask.

In some embodiments, the etching process (or the last one in the one or more etching process) is etching stop at the first signal lines SL1 and the first insulation layer 210. The first signal lines SL1 are exposed by the first openings OP1, and the first insulation layer 210 is exposed by the second openings OP2.

In some embodiments, the material of the first insulation layer 210 is different form the material of the first dielectric layer 220 and the material of the second dielectric layer 230, such that the first insulation layer 210 may have an etching rate different from that of the first dielectric layer 220 and the second dielectric layer 230 in the etching process. In some embodiments, an etching stop layer (not shown) is disposed between the first insulation layer 210 and the first dielectric layer 220, so even if the first insulation layer 210 and the first dielectric layer 220 have the same material, the second openings OP2 can be prevented from penetrating through the first insulation layer 210. In some embodiments, the etching process is stopped at the first insulation layer 210 by controlling the etching time, however, part of the second openings OP2 may extend into the first insulation layer 210.

Figure 6A:
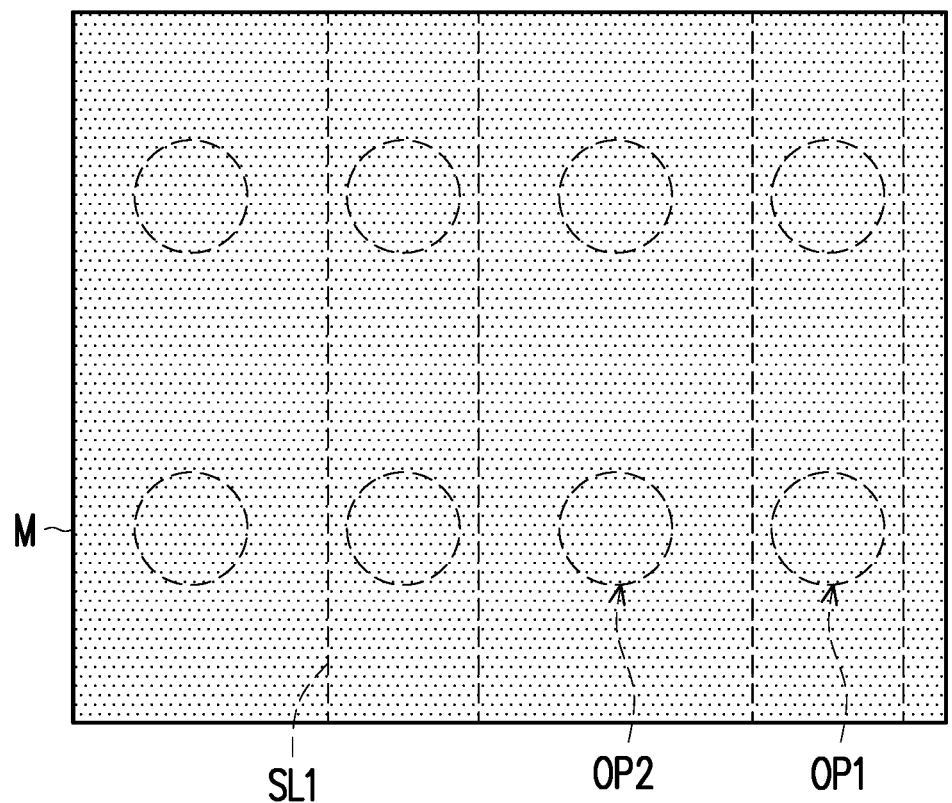
Figure 6B:
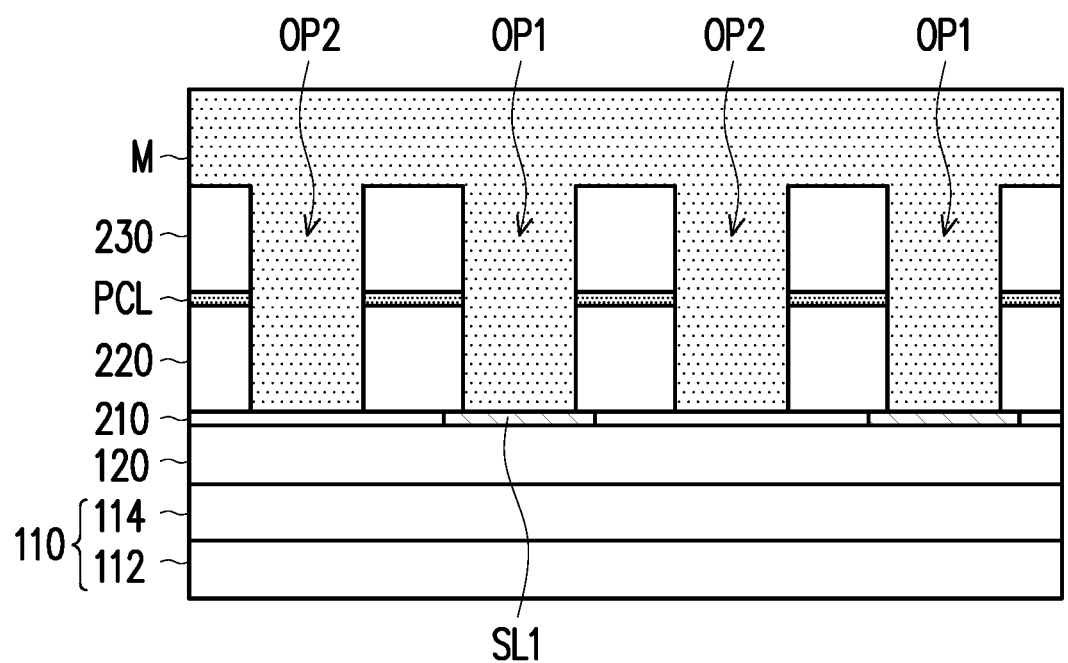
Figure 7A:
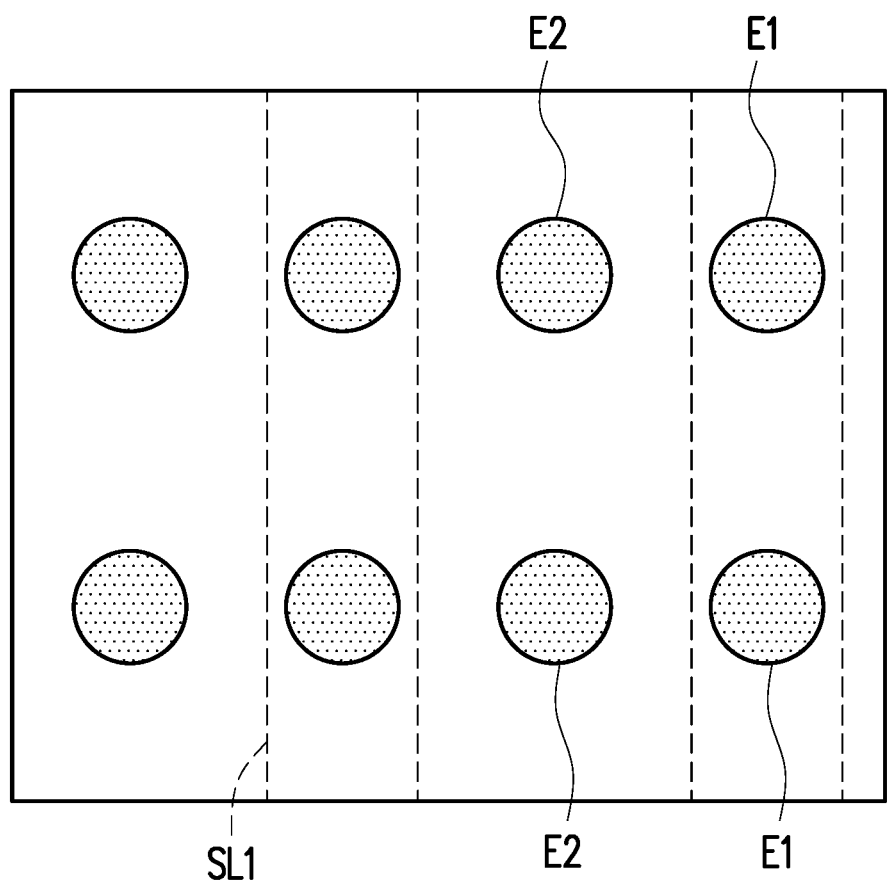
Figure 7B:
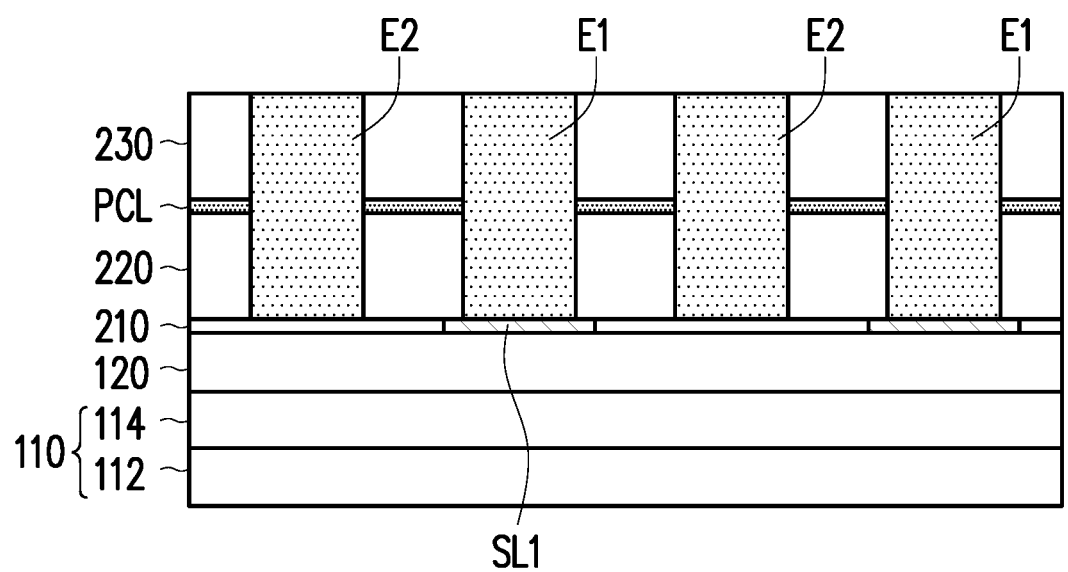

First electrodes E1 and second electrodes E2 are formed in the first openings OP1 and the second openings OP2, respectively. In this embodiment, a conductive material layer M is formed over the second dielectric layer 230 and filling into the first openings OP1 and the second openings OP2, as shown in FIGS. 6A and 6B. Then, in FIGS. 7A and 7B, a portion of the conductive material layer M outside the first openings OP1 and the second openings OP2 is removed by, for example, a chemical-mechanical-polishing (CMP) process, so as to obtain the first electrodes E1 located in the first openings OP1 and the second electrodes E2 located in the second openings OP2.

Figure 8A:
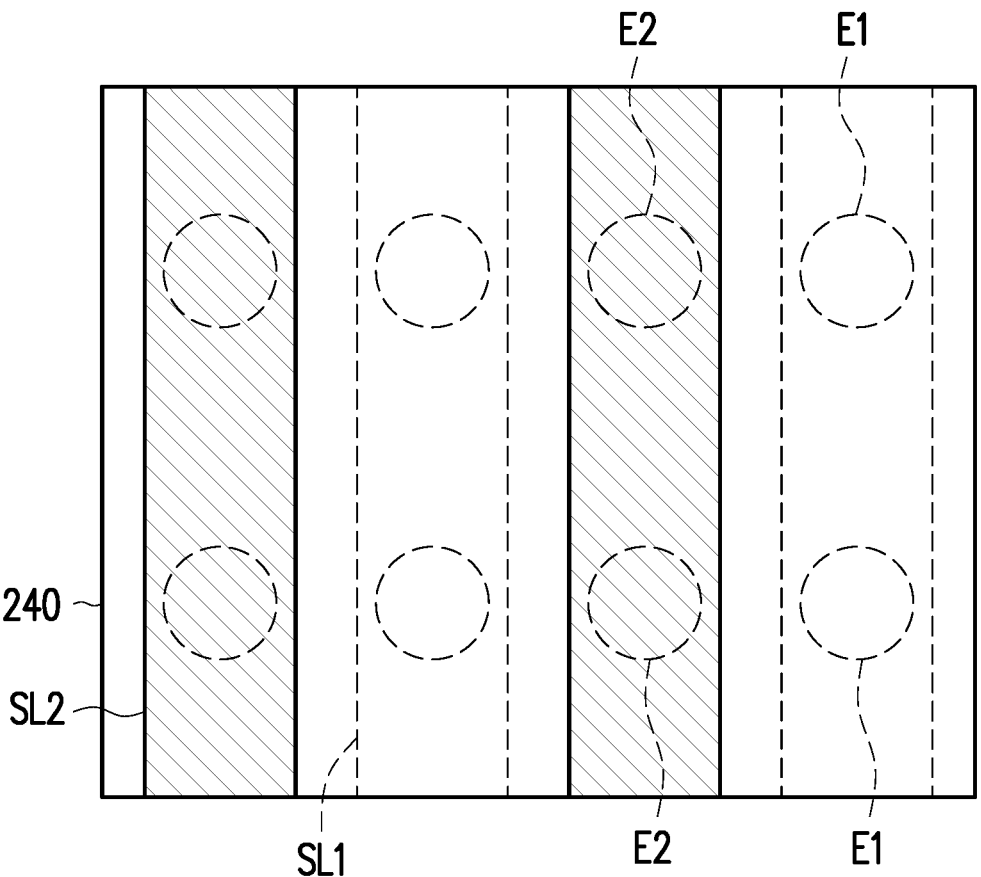
Figure 8B:
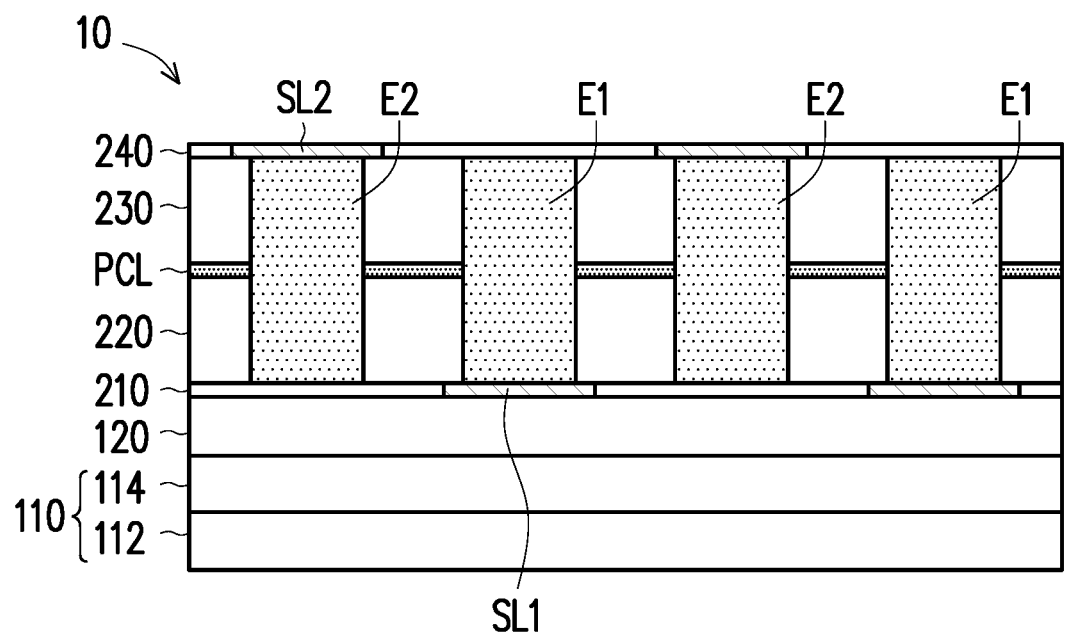

Referring to FIGS. 8A and 8B, the second signal lines SL2 embedded in the second insulation layer 240 are formed over the second dielectric layer 230 and the second electrodes E2. The second signal lines SL2 are electrically connected with the second electrodes E2. In some embodiments, the second signal lines SL2 may be formed by a damascene process. Specifically, a plurality of openings are formed in the insulation layer 240. Then, filling material is formed in the openings of the insulation layer 240. The filling material is electrically connected to the second electrodes E2. Then, excessive portion of the filling material is removed by, for example, a CMP process to form the second signal lines SL2 embedded in the second insulation layer 240.

Figure 9:
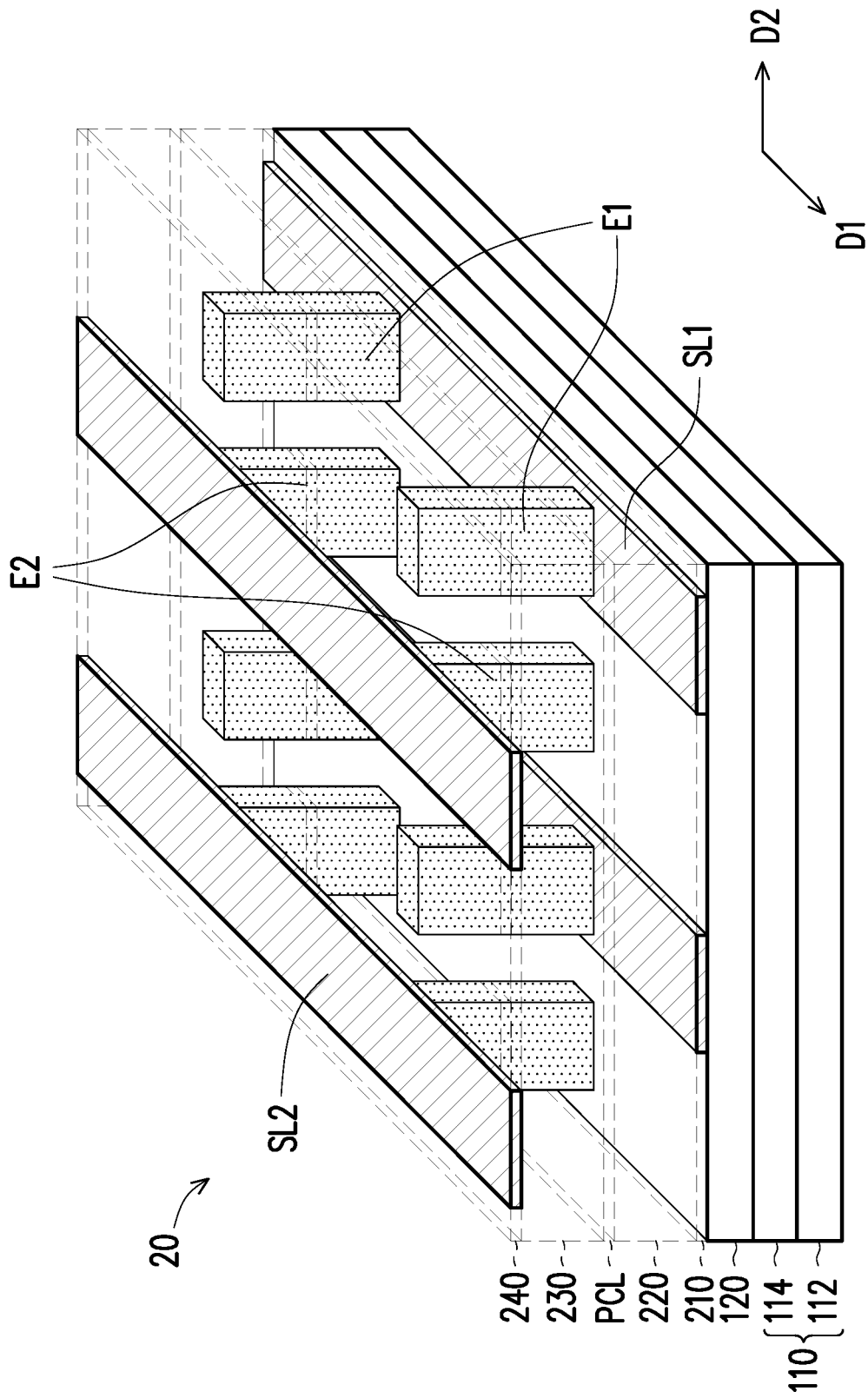
FIG. 9 is a perspective view of a memory device in accordance with various embodiments of the present disclosure.

FIG. 9 is a perspective view of a memory device 20 in accordance with various embodiments of the present disclosure. It should be noted herein that, in embodiments provided in FIG. 9, element numerals and partial content of the embodiments provided in FIG. 1 are followed, the same or similar reference numerals being used to represent the same or similar elements, and description of the same technical content being omitted. For a description of an omitted part, reference may be made to the foregoing embodiment, and the descriptions thereof are omitted herein.

The different between the memory device 20 in FIG. 9 and the memory device 10 in FIG. 1 is that: Each of the first electrodes E1 and the second electrodes E2 is a cylinder in the memory device 10, but each of the first electrodes E1 and the second electrodes E2 is a square column in the memory device 20.

Figure 10A:
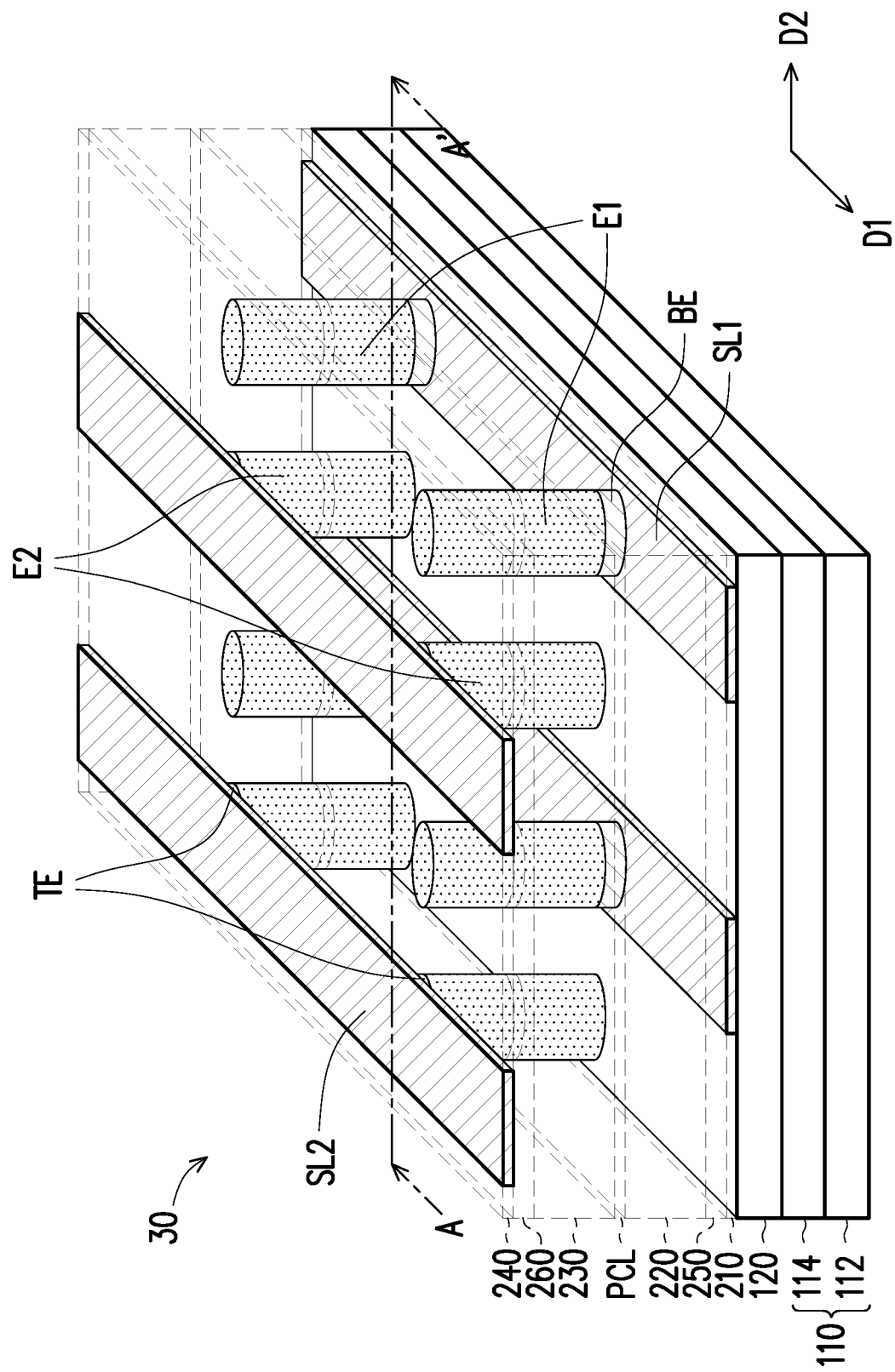
FIG. 10A is a perspective view of a memory device in accordance with various embodiments of the present disclosure.
Figure 10B:
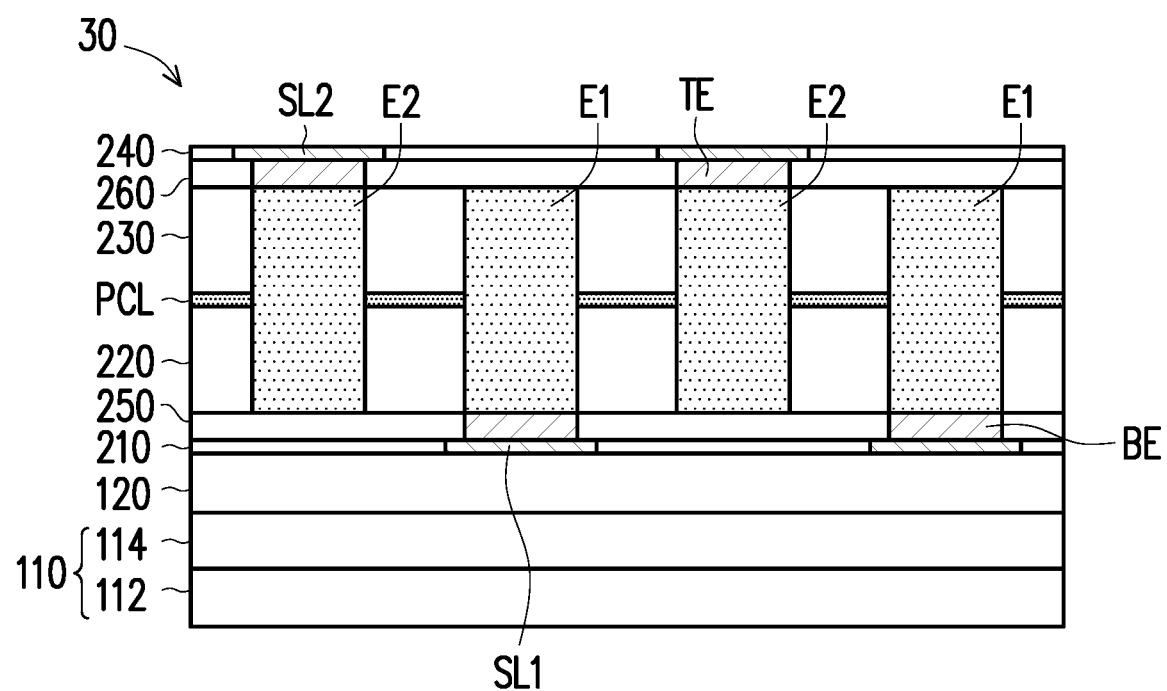
FIG. 10B schematically illustrates a cross-sectional view of the memory device in FIG. 10A.

FIG. 10A is a perspective view of a memory device 30 in accordance with various embodiments of the present disclosure. FIG. 10B schematically illustrates a cross-sectional view of the memory device 30 in FIG. 10A. FIG. 10B is corresponding to line A-A' of FIG. 10A. It should be noted herein that, in embodiments provided in FIGS. 10A and 10B, element numerals and partial content of the embodiments provided in FIG. 1 are followed, the same or similar reference numerals being used to represent the same or similar elements, and description of the same technical content being omitted. For a description of an omitted part, reference may be made to the foregoing embodiment, and the descriptions thereof are omitted herein.

The different between the memory device 30 in FIG. 10A and the memory device 10 in FIG. 1 is that: the memory device 30 further includes bottom electrodes BE, a dielectric layer 250, top electrodes TE and a dielectric layer 260.

Referring to FIGS. 10A and 10B, the dielectric layer 250 is disposed between the first dielectric layer 220 and the first insulation layer 210. The bottom electrodes BE are embedded in the dielectric layer 250 and disposed between the first signal lines SL1 and the first electrodes E1. In this embodiment, the bottom surfaces of the first electrodes E1 are in contact with the bottom electrodes BE, and the bottom surfaces of the second electrodes E2 are in contact with the dielectric layer 250.

The dielectric layer 260 is disposed between the second dielectric layer 230 and the second insulation layer 240. The top electrodes TE are embedded in the dielectric layer 260 and disposed between the second signal lines SL2 and the second electrodes E2. In this embodiment, the top surfaces of the first electrodes E1 are in contact with the dielectric layer 260, and the top surfaces of the second electrodes E2 are in contact with the top electrodes TE.

Figure 11:
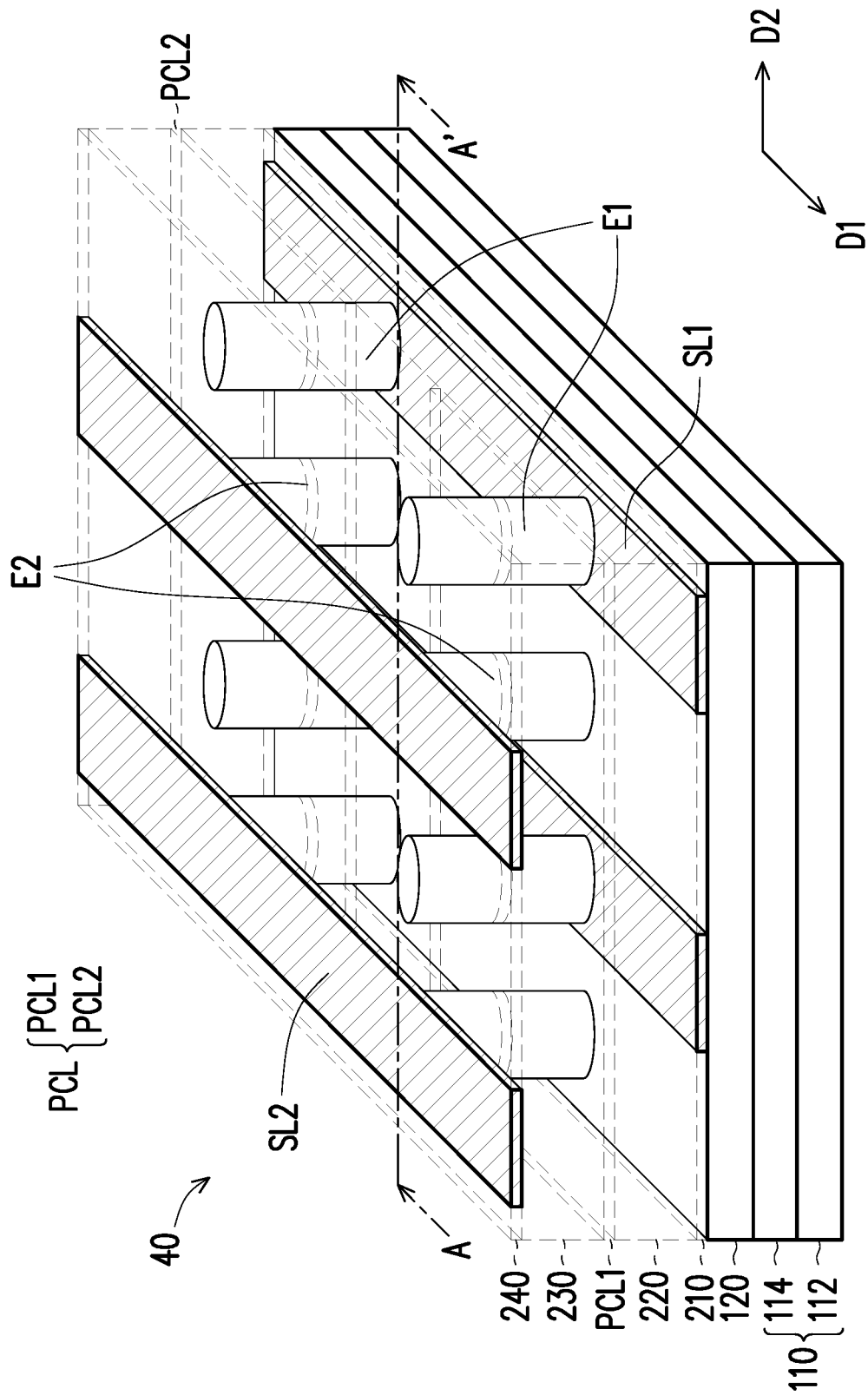
FIG. 11 is a perspective view of a memory device in accordance with various embodiments of the present disclosure.

FIG. 11 is a perspective view of a memory device 40 in accordance with various embodiments of the present disclosure. It should be noted herein that, in embodiments provided in FIG. 11, element numerals and partial content of the embodiments provided in FIG. 1 are followed, the same or similar reference numerals being used to represent the same or similar elements, and description of the same technical content being omitted. For a description of an omitted part, reference may be made to the foregoing embodiment, and the descriptions thereof are omitted herein.

The different between the memory device 40 in FIG. 11 and the memory device 10 in FIG. 1 is that: the phase change layer PCL of the memory device 40 is a patterned layer.

Referring to FIG. 11, the phase change layer PCL includes a first portion PCL1 and a second portion PCL2 separated from the first portion PCL1. The second dielectric layer 230 fills into the gap between the first portion PCL1 and the second portion PCL2 and connects to the first dielectric layer 220.

The first signal lines SL1 and the second signal lines SL2 are extending along the first direction D1, and the first portion PCL1 and the second portion PCL2 are extending along the second direction D2 not parallel to the first direction D1. In some embodiments, the second direction D2 is perpendicular to the first direction D1.

In this embodiment, a part of the first electrodes E1 and a part of the second electrodes E2 are penetrating through the first portion PCL1, and another part of the first electrodes E1 and another part of the second electrodes E2 are penetrating through the second portion PCL2. That is, the part of the first electrodes E1 and the part of the second electrodes E2 are surrounded by the first portion PCL1, and the other part of the first electrodes E1 and the other part of the second electrodes E2 are surrounded by the second portion PCL2. The part of the first electrodes E1 and the part of the second electrodes E2 are alternately arranged along the second direction D2, and the other part of the first electrodes E1 and the other part of the second electrodes E2 are also alternately arranged along the second direction D2.

FIGS. 12A to 17A schematically illustrates top views of the fabrication method of the memory device in FIG. 11. FIGS. 12B to 17B schematically illustrates cross-sectional views of the fabrication method of the memory device in FIG. 11. Various operations of the fabrication method are discussed in association with cross-section diagrams FIGS. 12B to 17B, where illustrate cross-sectional views along the line A-A illustrated in FIG. 11. FIGS. 12A to 17A are in association with top views of structures in FIGS. 12B to 17B, respectively.

Figure 12A:
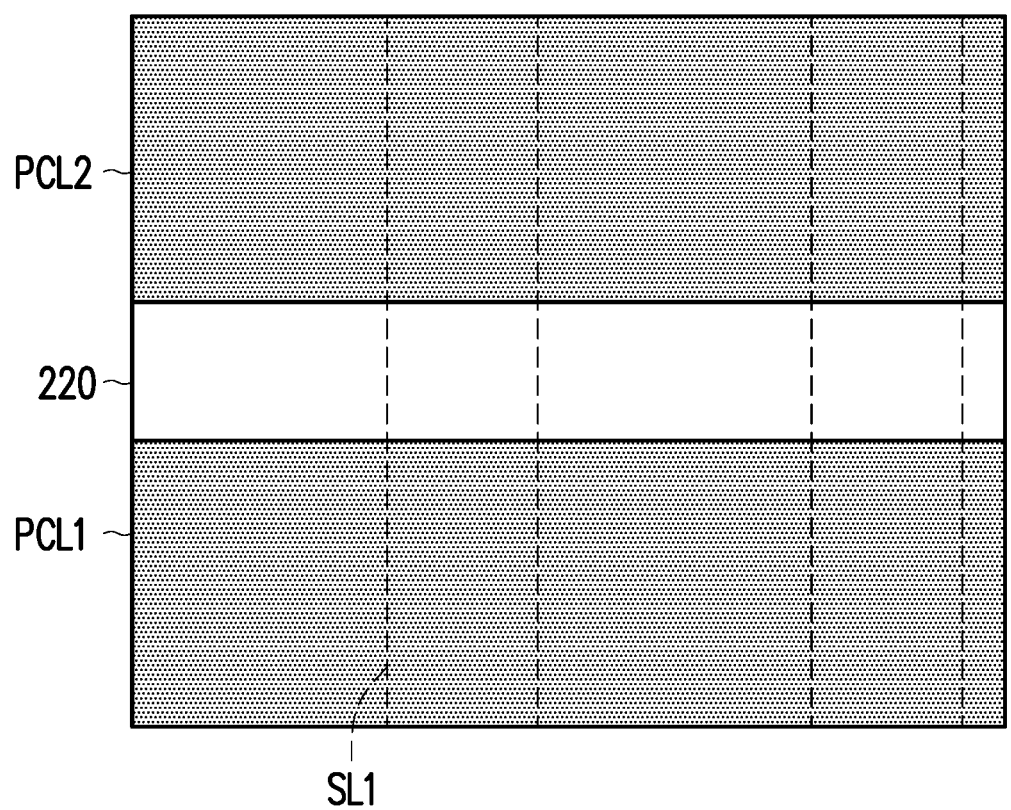
Figure 12B:
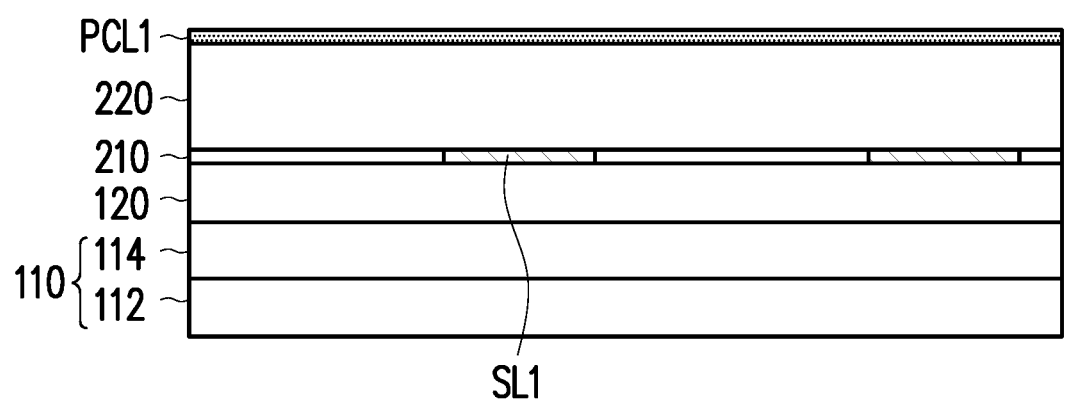

Referring to FIGS. 12A and 12B, a phase change layer is formed over the first dielectric layer 220. Then, the phase change layer is patterned to form the first portion PCL1 and the second portion PCL2.

Figure 13A:
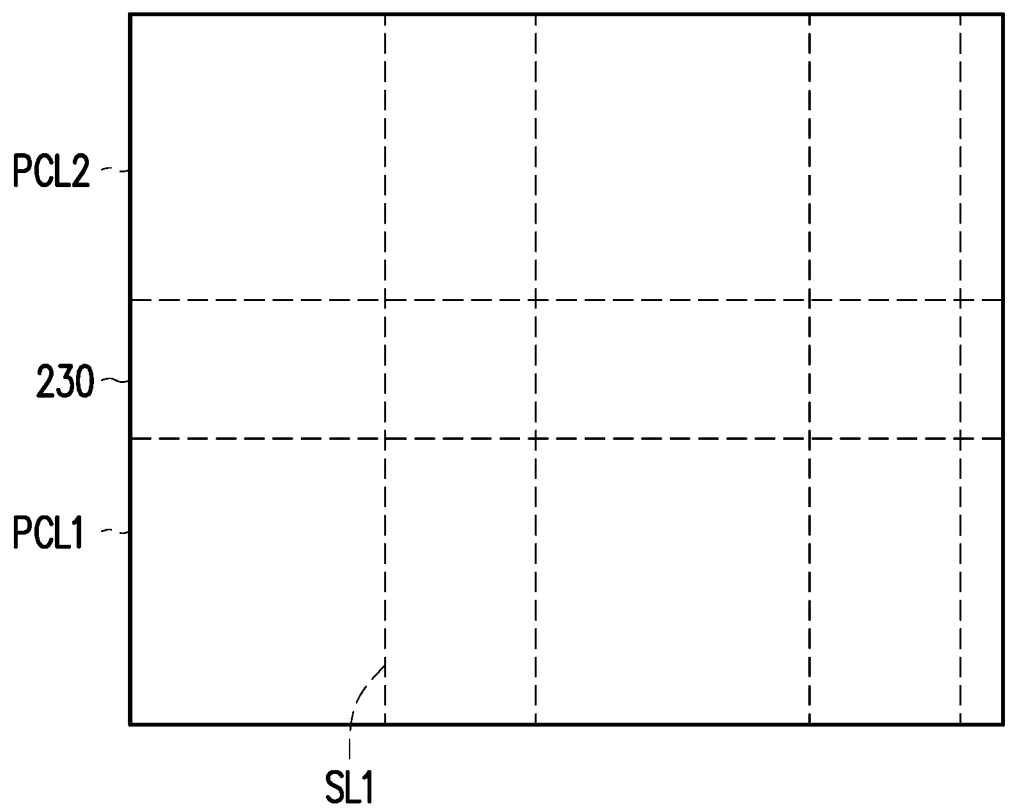
Figure 13B:
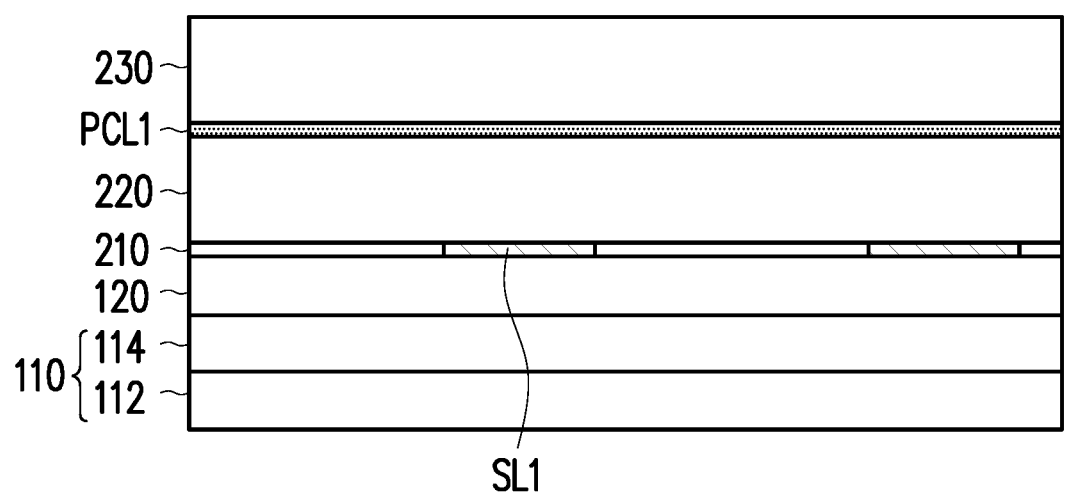

Referring to FIGS. 13A and 13B, a second dielectric layer 230 is formed over the first portion PCL1 and the second portion PCL2, and filling into the gap between the first portion PCL1 and the second portion PCL2.

Figure 14A:
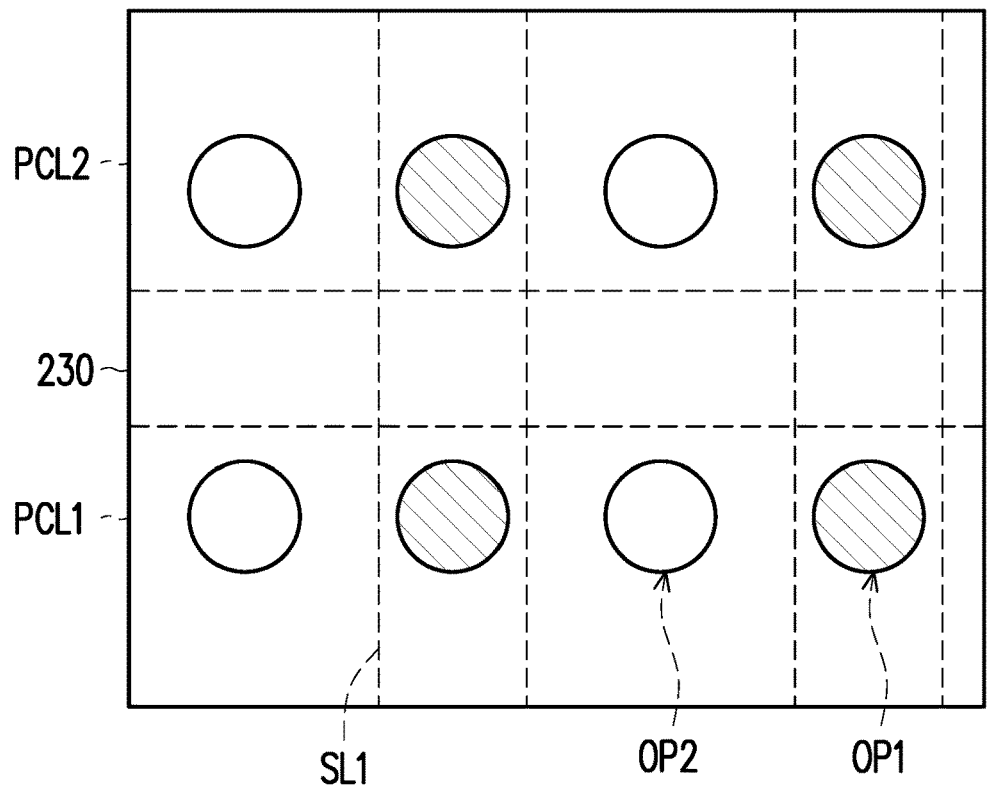
Figure 14B:
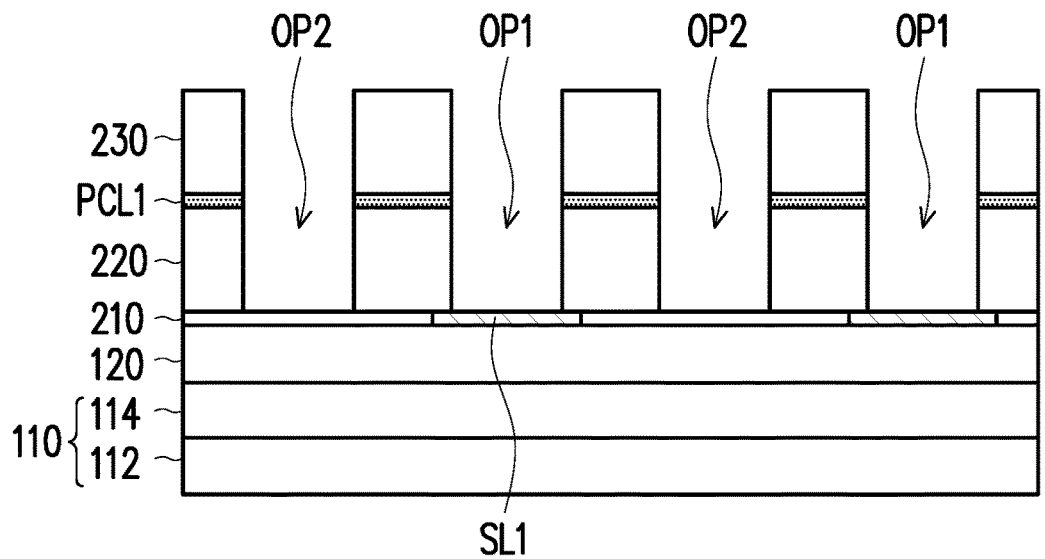

Referring to FIGS. 14A and 14B, first openings OP1 and second openings OP2 are formed in the first dielectric layer 220, the phase change layer PCL and the second dielectric layer 230. The first openings OP1 and the second openings OP2 are penetrating through the first dielectric layer 220, the phase change layer PCL and the second dielectric layer 230.

In some embodiments, the method of forming the first openings OP1 and second openings OP2 includes: forming a hard mask layer (not shown) on the second dielectric layer 230; forming a patterned photoresist layer (not shown) on the hard mask layer; using the patterned photoresist layer as a mask to pattern the hard mask layer; then, using the residual hard mask layer as a mask to pattern the first dielectric layer 220, the phase change layer PCL and the second dielectric layer 230. In some embodiments, the first openings OP1 and the second openings OP2 are formed in one or more etching process using the same mask.

Figure 15A:
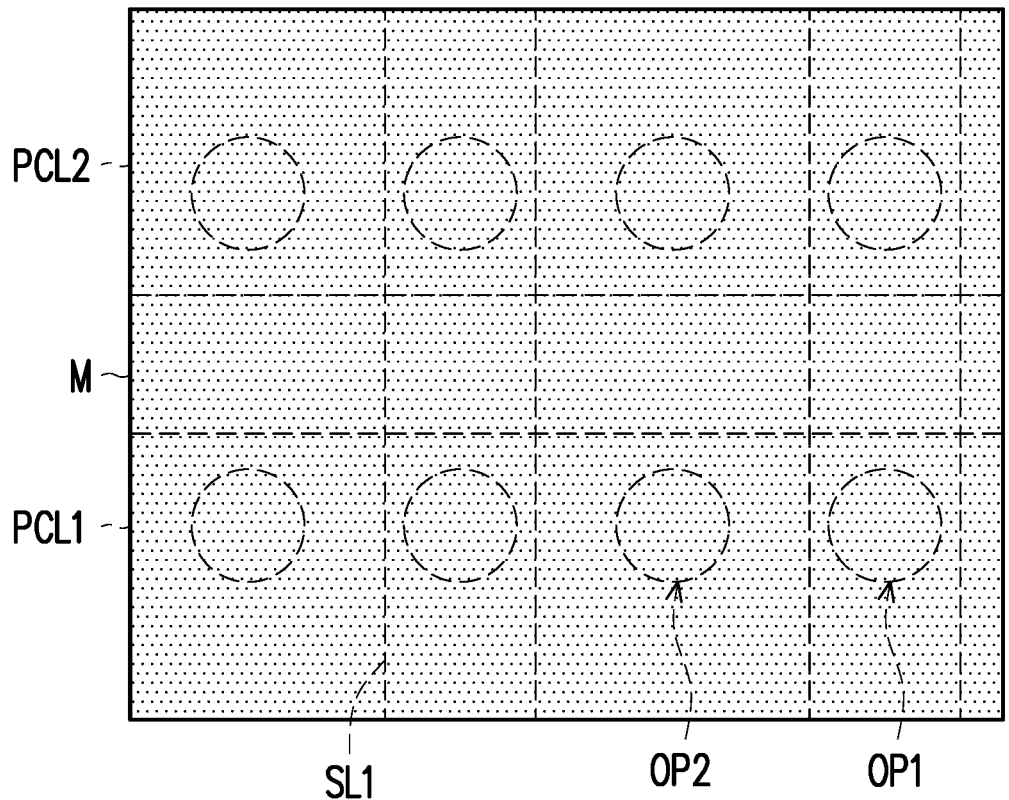
Figure 15B:
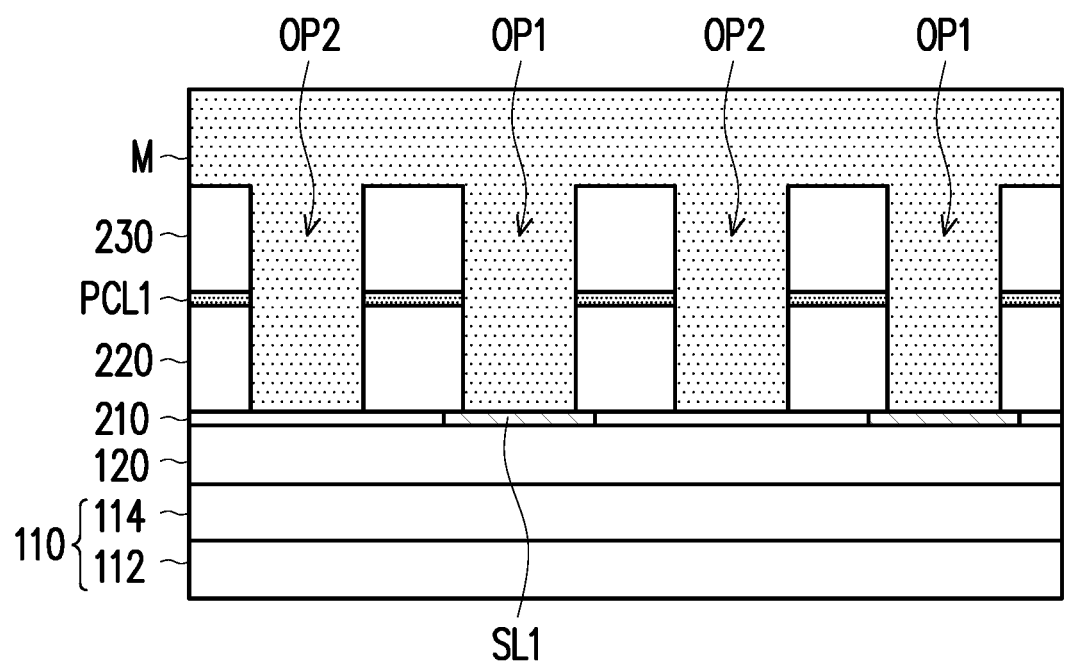
Figure 16A:
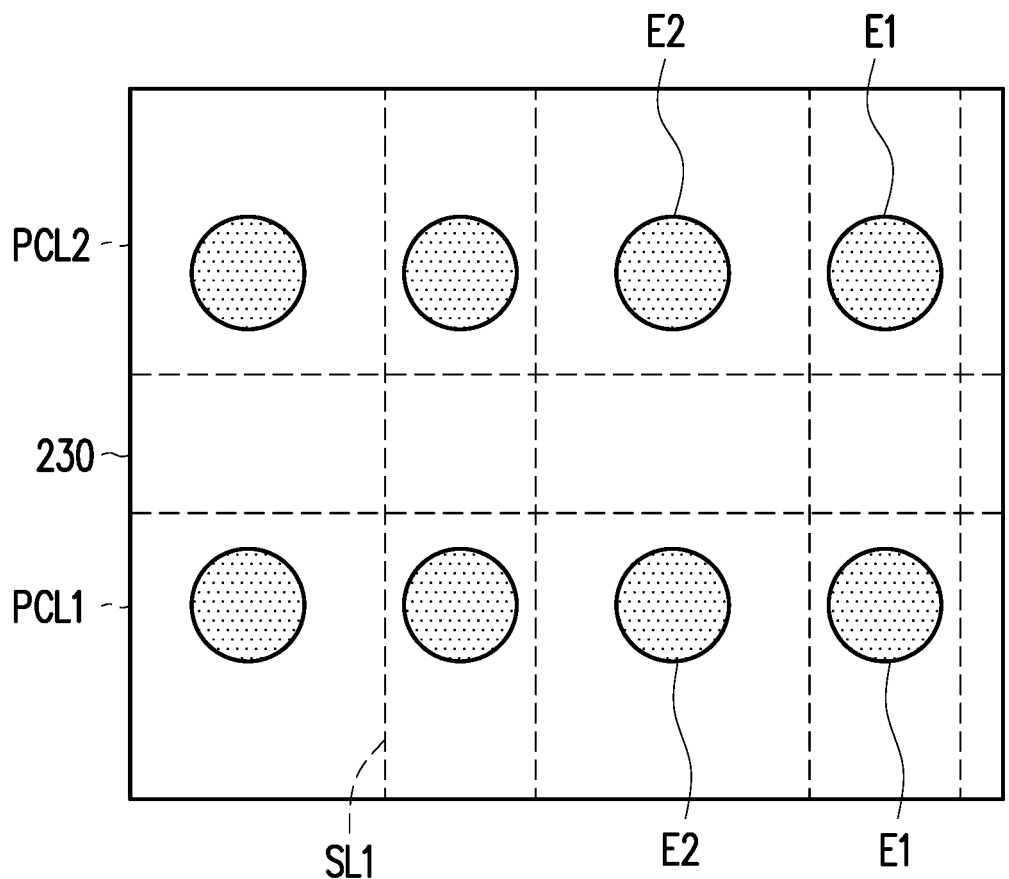
Figure 16B:
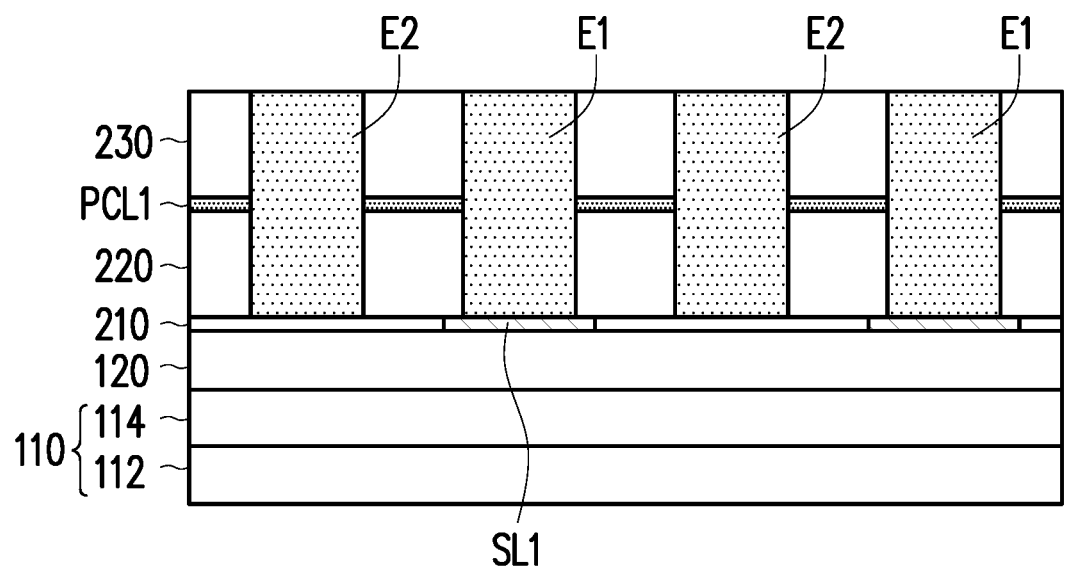

First electrodes E1 and second electrodes E2 are formed in the first openings OP1 and the second openings OP2, respectively. In this embodiment, a conductive material layer M is formed over the second dielectric layer 230 and filling into the first openings OP1 and the second openings OP2, as shown in FIGS. 15A and 15B. Then, in FIGS. 16A and 16B, a portion of the conductive material layer M outside the first openings OP1 and the second openings OP2 is removed by, for example, a chemical-mechanical-polishing (CMP) process, so as to obtain the first electrodes E1 located in the first openings OP1 and the second electrodes E2 located in the second openings OP2.

Figure 17A:
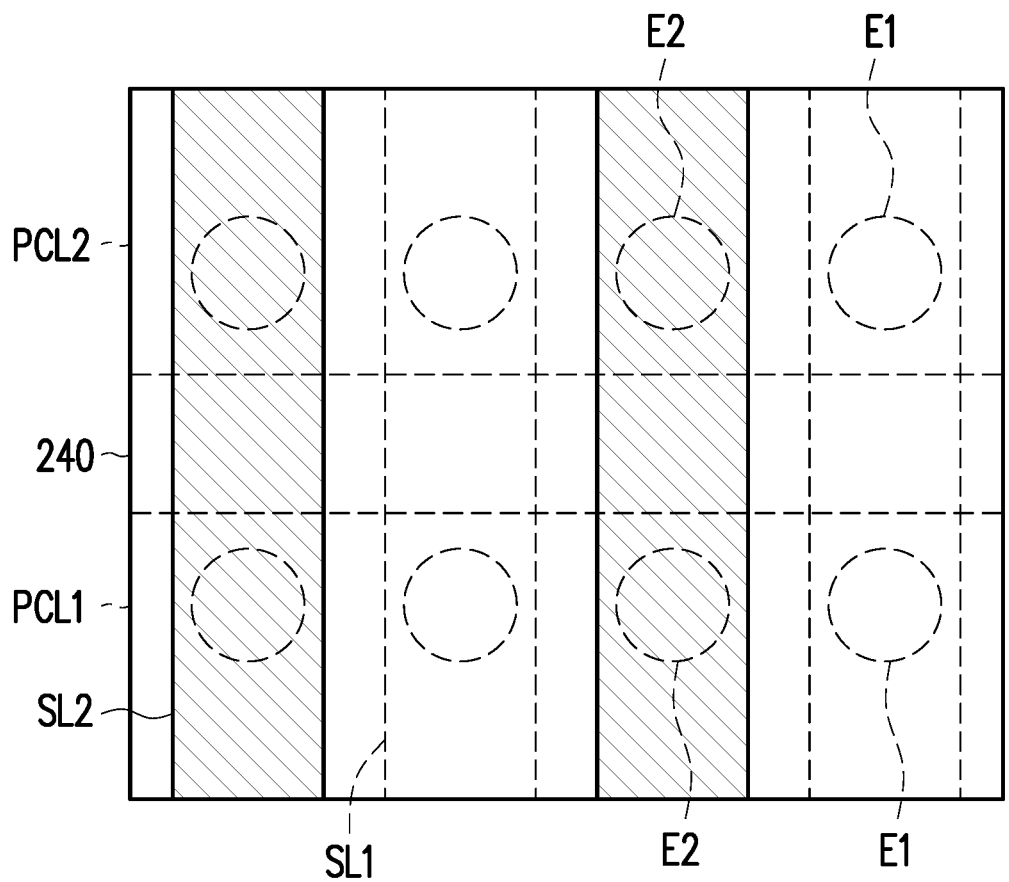
Figure 17B:
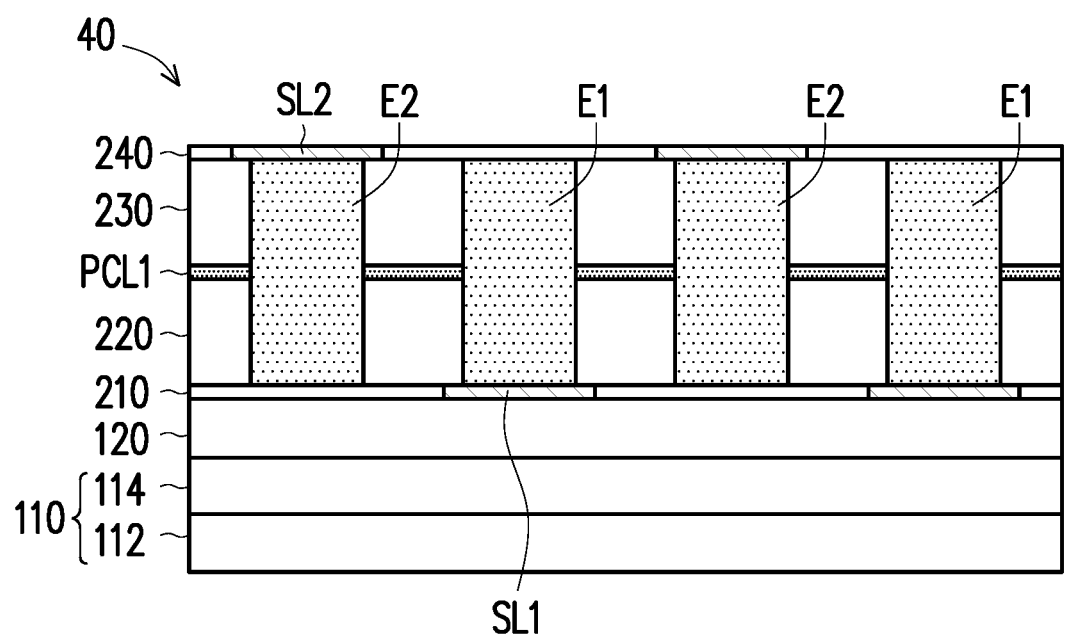

Referring to FIGS. 17A and 17B, the second signal lines SL2 embedded in the second insulation layer 240 are formed over the second dielectric layer 230 and the second electrodes E2. The second signal lines SL2 are electrically connected with the second electrodes E2. In some embodiments, the second signal lines SL2 may be formed by a damascene process. Specifically, a plurality of openings are formed in the insulation layer 240. Then, filling material is formed in the openings of the insulation layer 240. The filling material is electrically connected to the second electrodes E2. Then, excessive portion of the filling material is removed by, for example, a CMP process to form the second signal lines SL2 embedded in the second insulation layer 240.

Figure 18:
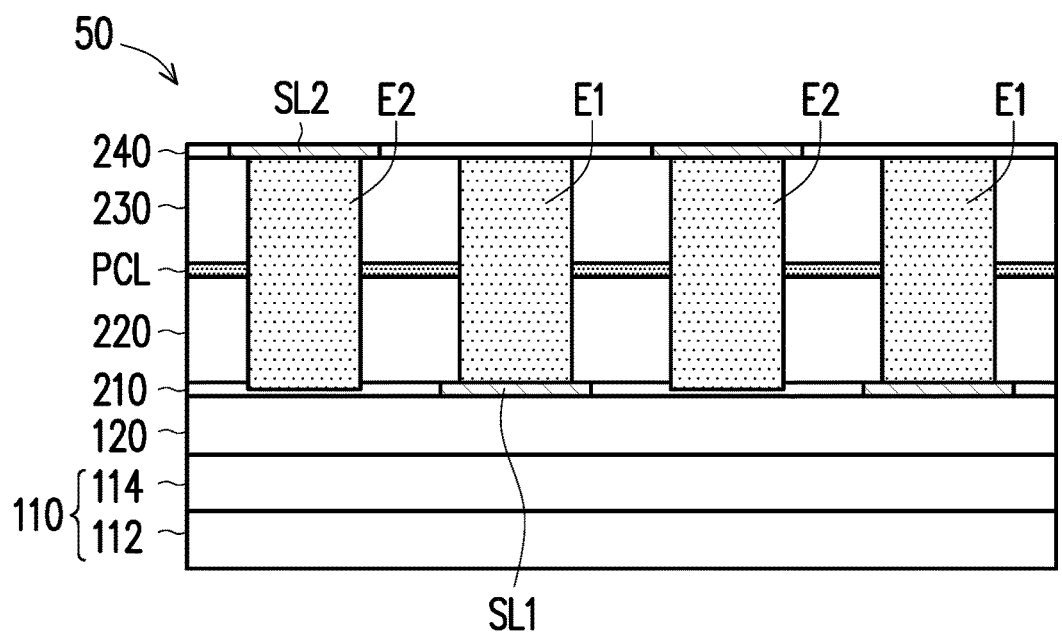
FIG. 18 is a perspective view of a memory device in accordance with various embodiments of the present disclosure.

FIG. 18 is a perspective view of a memory device 50 in accordance with various embodiments of the present disclosure. It should be noted herein that, in embodiments provided in FIG. 18, element numerals and partial content of the embodiments provided in FIG. 1 are followed, the same or similar reference numerals being used to represent the same or similar elements, and description of the same technical content being omitted. For a description of an omitted part, reference may be made to the foregoing embodiment, and the descriptions thereof are omitted herein.

The different between the memory device 50 in FIG. 18 and the memory device 10 in FIG. 1 is that: the bottom surfaces of the first electrodes E1 and the bottom surfaces of the second electrodes E2 are coplanar in the memory device 10, but the bottom surfaces of the first electrodes E1 and the bottom surfaces of the second electrodes E2 are not coplanar in the memory device 50.

Referring to FIG. 18, the second electrodes E2 are extending into the first insulation layer 210. In this embodiment, after the etching process of the first dielectric layer 220, the phase change layer PCL and the second dielectric layer 230 (such as the process shown in FIGS. 5A and 5B), the second openings extend into the first insulation layer 210. Therefore, the subsequently formed second electrodes E2 are extending into the first insulation layer 210.

Figure 19:
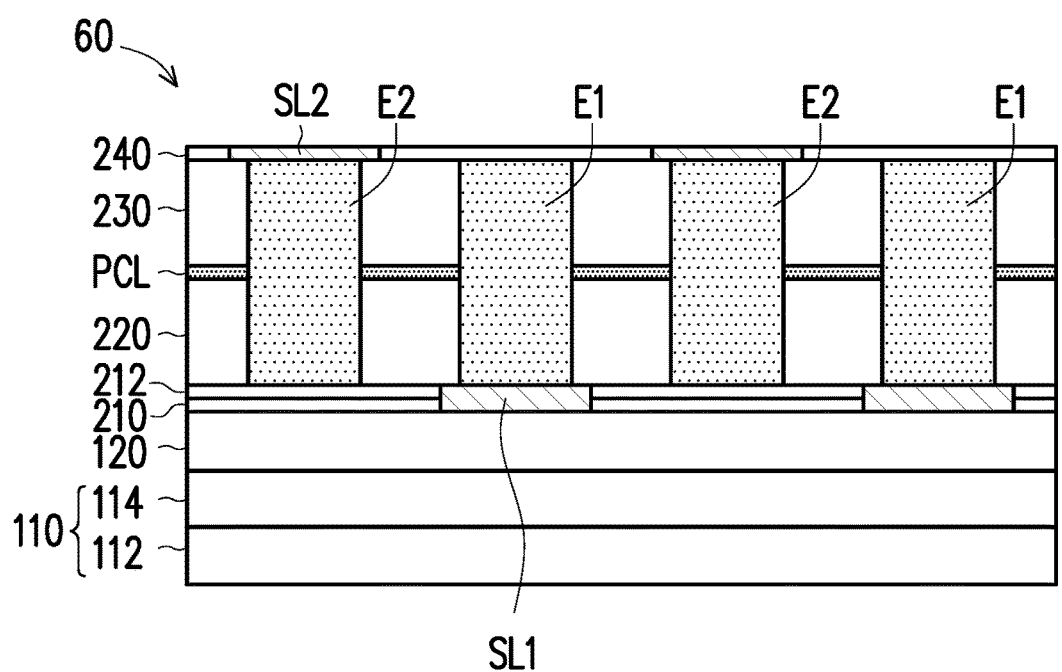
FIG. 19 is a perspective view of a memory device in accordance with various embodiments of the present disclosure.

FIG. 19 is a perspective view of a memory device 60 in accordance with various embodiments of the present disclosure. It should be noted herein that, in embodiments provided in FIG. 19, element numerals and partial content of the embodiments provided in FIG. 1 are followed, the same or similar reference numerals being used to represent the same or similar elements, and description of the same technical content being omitted. For a description of an omitted part, reference may be made to the foregoing embodiment, and the descriptions thereof are omitted herein.

The different between the memory device 60 in FIG. 19 and the memory device 10 in FIG. 1 is that: the memory device 60 further includes an etching stop layer 212 located between the first insulation layer 210 and the first dielectric layer 220.

Referring to FIG. 19, the etching stop layer 212 is located below the second electrodes E2. In some embodiments, the etching stop layer 212 may be a hard mask layer which is used in the patterning process of the first insulation layer 210. For example, the etching stop layer 212 may be used as a mask to pattern the first insulation layer 210, so as to form the openings for accommodating the first signal lines SL1.

The etching stop layer 212 can protect the first insulation layer 210 during the etching process of the first dielectric layer 220, the phase change layer PCL and the second dielectric layer 230, thereby preventing the subsequently formed second electrodes E2 from extending into the first insulation layer 210.

In according to some embodiments, a memory device includes a substrate, a first signal line, a first dielectric layer, a phase change layer, a second dielectric layer, a first electrode, a second electrode and a second signal line. The first signal line is disposed over the substrate. The first dielectric layer is disposed over the first signal line. The phase change layer is disposed over the first dielectric layer. The second dielectric layer is disposed over the phase change layer. The first electrode and the second electrode are penetrating through the first dielectric layer, the phase change layer and the second dielectric layer, wherein the phase change layer is located between a sidewall of the first electrode and a sidewall of the second electrode. The second signal line is disposed over the second dielectric layer, wherein the first signal line is electrically connected with the first electrode, and the second signal line is electrically connected with the second electrode.

In according to some embodiments, a memory device includes a substrate, a first insulation layer, first signal lines, a first dielectric layer, a phase change layer, a second dielectric layer, first electrodes, second electrodes, a second insulation layer and second signal lines. The first insulation layer is disposed over the substrate. The first signal lines are disposed in the first insulation. The first dielectric layer is disposed over the first signal lines. The phase change layer is located between the first dielectric layer and the second dielectric layer. The first electrodes and the second electrodes are located in the first dielectric layer, the phase change layer and the second dielectric layer, wherein the phase change layer is surrounding the first electrodes and the second electrodes. The second insulation layer is disposed over the second dielectric layer. The second signal lines are disposed in the second insulation layer, wherein the first signal lines are electrically connected with the first electrodes, and the second signal lines are electrically connected with the second electrodes.

In according to some embodiments, a fabrication method of a memory device includes: forming a first signal line over a substrate; forming a first dielectric layer over the first signal line; forming a phase change layer over the first dielectric layer; forming a second dielectric layer over the phase change layer; forming a first opening and a second opening penetrating through the first dielectric layer, the phase change layer and the second dielectric layer, wherein the first signal line is exposed by the first opening; forming a first electrode and a second electrode, wherein the first electrode is located in the first opening and electrically connected with the first signal line, and the second electrode is located in the second opening; and forming a second signal line over the second dielectric layer and the second electrode, wherein the second signal line is electrically connected with the second electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a substrate;
   a first signal line over the substrate;
   a first dielectric layer over the first signal line;
   a first insulation layer disposed between the first dielectric layer and the substrate, wherein the first signal line is located in the first insulation layer;
   a phase change layer over the first dielectric layer;
   a second dielectric layer over the phase change layer;
   a first electrode and a second electrode penetrating through the first dielectric layer, the phase change layer and the second dielectric layer, wherein the phase change layer is located between a sidewall of the first electrode and a sidewall of the second electrode, and a bottom surface of the second electrode is in direct contact with the first insulation layer; and
a second signal line over the second dielectric layer, wherein the first signal line is electrically connected with the first electrode, and the second signal line is electrically connected with the second electrode.

2. The memory device according to claim 1, wherein each of the first dielectric layer, the phase change layer and the second dielectric layer are surrounding the first electrode and the second electrode, and each of the first dielectric layer, the phase change layer and the second dielectric layer are in contact with the sidewall of the first electrode and the sidewall of the second electrode.

3. The memory device according to claim 1, further comprising:
a second insulation layer disposed above the second dielectric layer, wherein the second signal line is located in the second insulation layer, wherein a top surface of the first electrode is in contact with the second insulation layer, a top surface of the second electrode is in contact with the second signal line, and a bottom surface of the first electrode is in contact with the first signal line.

4. The memory device according to claim 1, wherein the first signal line is parallel to the second signal line.

5. The memory device according to claim 4, wherein the first signal line and the second signal line are extending along a first direction, and the first electrode and the second electrode are arranged along a second direction not parallel to the first direction.

6. The memory device according to claim 1, further comprising:
a top electrode disposed between the second signal line and the second electrode.

7. A memory device, comprising:
a substrate;
a first insulation layer over the substrate;
first signal lines in the first insulation;
a first dielectric layer over the first signal lines;
a phase change layer;
a second dielectric layer, wherein the phase change layer is located between the first dielectric layer and the second dielectric layer;
first electrodes and second electrodes located in the first dielectric layer, the phase change layer and the second dielectric layer, wherein the phase change layer is surrounding the first electrodes and the second electrodes;
a second insulation layer over the second dielectric layer, wherein top surfaces of the first electrodes are in direct contact with the second insulation layer; and
second signal lines in the second insulation layer, wherein the first signal lines are electrically connected with the first electrodes, and the second signal lines are electrically connected with the second electrodes.

8. The memory device according to claim 7, wherein the phase change layer comprises a first portion and a second portion separated from the first portion, a part of the first electrodes and a part of the second electrodes are penetrating through the first portion, and another part of the first electrodes and another part of the second electrodes are penetrating through the second portion.

9. The memory device according to claim 8, wherein the first signal lines and the second signal lines are extending along a first direction, and the part of the first electrodes and the part of the second electrodes are alternately arranged along a second direction not parallel to the first direction.

10. The memory device according to claim 8, wherein the first signal lines and the second signal lines are extending along a first direction, and the first portion and the second portion are extending along a second direction not parallel to the first direction.

11. The memory device according to claim 7, wherein bottom surfaces of the first electrodes are in contact with the first signal lines, bottom surfaces of the second electrodes are in contact with the first insulation layer, and top surfaces of the second electrodes are in contact with the second signal lines.

12. The memory device according to claim 7, wherein the phase change layer is in contact with sidewalls of the first electrodes and sidewalls of the second electrodes.

13. The memory device according to claim 12, wherein the first dielectric layer and the second dielectric layer are in contact with the sidewalls of the first electrodes and the sidewalls of the second electrodes.

14. A fabrication method of a memory device, comprising:
forming a first insulation layer and a first signal line located in the first insulation layer over a substrate;
forming a first dielectric layer over the first signal line, wherein the first insulation layer is disposed between the first dielectric layer and the substrate;
forming a phase change layer over the first dielectric layer;
forming a second dielectric layer over the phase change layer;
forming a first opening and a second opening penetrating through the first dielectric layer, the phase change layer and the second dielectric layer, wherein the first signal line is exposed by the first opening;
forming a first electrode and a second electrode penetrating through the first dielectric layer, the phase change layer and the second dielectric layer, wherein the first electrode is located in the first opening and electrically connected with the first signal line, and the second electrode is located in the second opening, wherein the phase change layer is located between a sidewall of the first electrode and a sidewall of the second electrode, and a bottom surface of the second electrode is in direct contact with the first insulation layer; and
forming a second signal line over the second dielectric layer and the second electrode, wherein the second signal line is electrically connected with the second electrode.

15. The fabrication method according to claim 14, wherein a method of forming the first electrode and the second electrode comprises:
forming a conductive material layer over the second dielectric layer, wherein the conductive material layer is filling into the first opening and the second opening; and
removing a portion of the conductive material layer outside the first opening and the second opening.

16. The fabrication method according to claim 14, further comprising:
patterning the phase change layer before forming the second dielectric layer.

17. The fabrication method according to claim 14, wherein the first opening and the second opening are formed in one or more etching process using a same mask.

18. The fabrication method according to claim 17, wherein
the first insulation layer is exposed by the second opening before forming the second electrode.

19. The fabrication method according to claim 18, wherein the last one in one or more etching process is etching stop at the first signal line and the first insulation layer.

20. The fabrication method according to claim 14, further comprising:
  forming a second insulation layer over the second dielectric layer, wherein the second signal line is embedded in the second insulation layer, and the first electrode is in contact with the second insulation layer.

* * * * *